United States Patent [19]
Nakano et al.

[11] Patent Number: 5,602,772
[45] Date of Patent: Feb. 11, 1997

[54] DYNAMIC SEMICONDUCTOR MEMORY DEVICE

[75] Inventors: Hiroaki Nakano; Daisaburo Takashima, both of Kawasaki; Tohru Ozaki, Tokyo, all of Japan

[73] Assignee: Kabushiki Kaisha Toshiba, Kawasaki, Japan

[21] Appl. No.: 308,926

[22] Filed: Sep. 20, 1994

[30] Foreign Application Priority Data

Sep. 21, 1993 [JP] Japan ................................. 5-235016
Mar. 15, 1994 [JP] Japan ................................. 6-043883

[51] Int. Cl.$^6$ ............................................................ C11C 5/02
[52] U.S. Cl. ............................ 365/51; 365/63; 365/206; 365/214
[58] Field of Search ............................... 365/51, 63, 149, 365/207, 214, 189.01, 206

[56] References Cited

U.S. PATENT DOCUMENTS 4,922,460  5/1990  Furutani et al. .................. 365/207
5,396,450  3/1995  Takashima et al. ............... 365/63 X

FOREIGN PATENT DOCUMENTS 0167281  1/1986  European Pat. Off. .

*Primary Examiner*—David C. Nelms
*Assistant Examiner*—Huan Hoang
*Attorney, Agent, or Firm*—Oblon, Spivak, McClelland, Maier & Neustadt, P.C.

[57] ABSTRACT

A dynamic semiconductor memory device according to the present invention, comprises a plurality of first bit lines, a plurality of second bit lines which are partially laminated above the first bit lines and, together with the first bit lines, form bit-line pairs to build a folded bit-line structure, a plurality of word lines arranged so as to cross the first bit lines and the second bit lines, and at least one memory cell array in which a plurality of memory cells connected to the first bit lines and the second bit lines are arranged in a matrix, wherein the memory cell array includes a plurality of first areas in which a plurality of memory cells are arranged, and a plurality of second memory areas which are arranged so as to alternate with the first areas and contain no memory cell, and the second memory areas include areas where the first bit lines of the specified number of the bit-line pairs are connected to the second bit lines and the second bit lines are connected to the first bit lines.

13 Claims, 20 Drawing Sheets

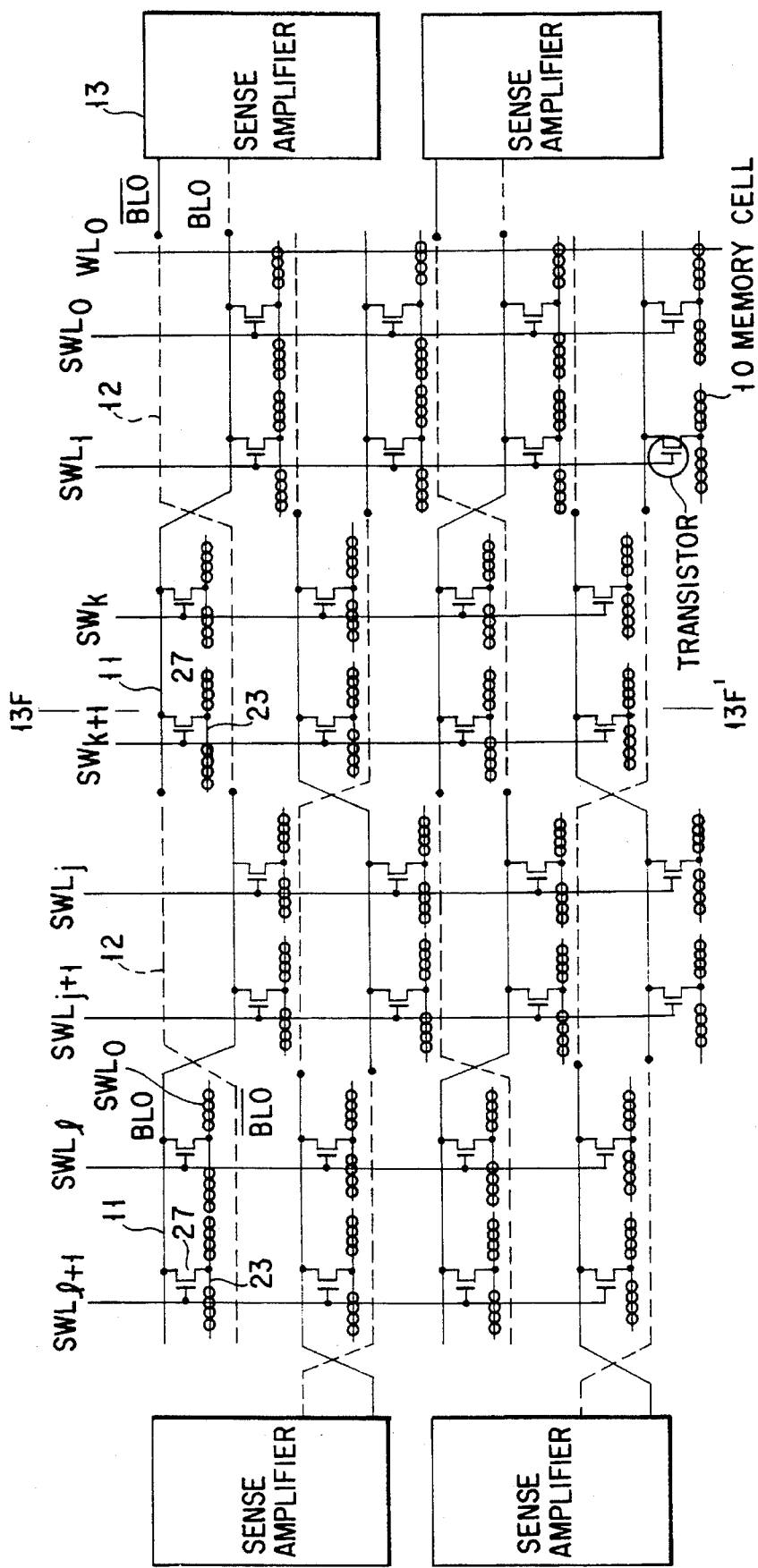
F I G. 12

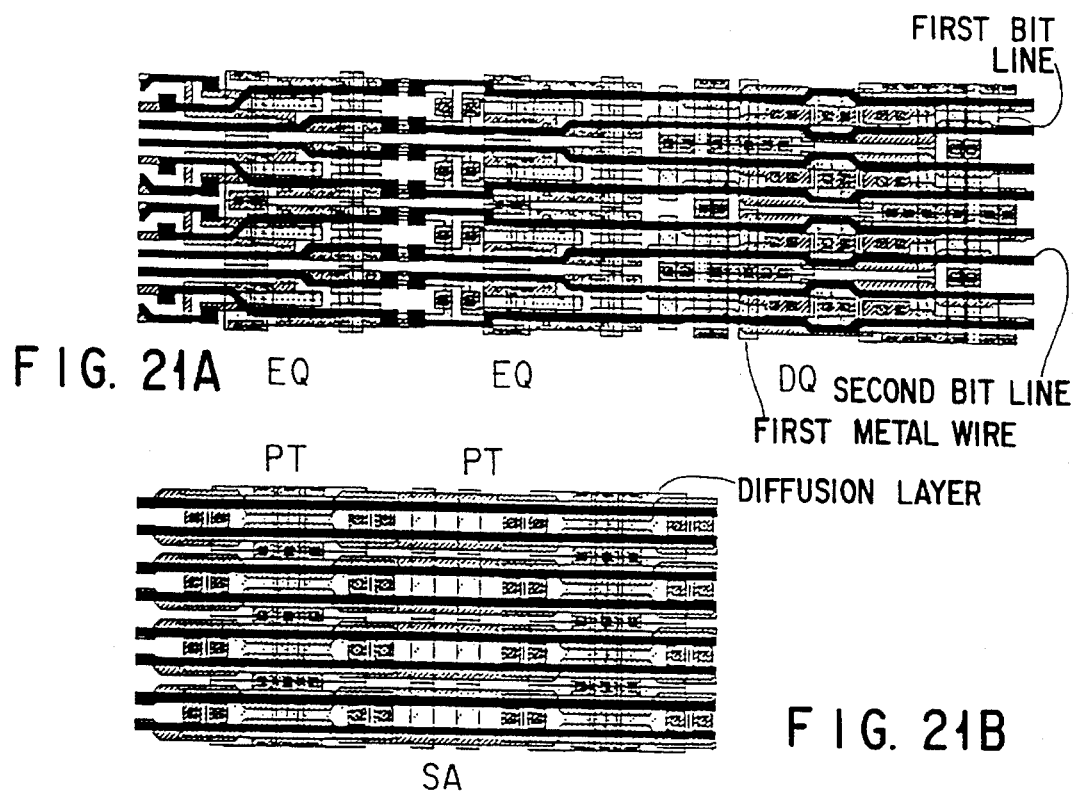
FIG. 21A
FIG. 21B
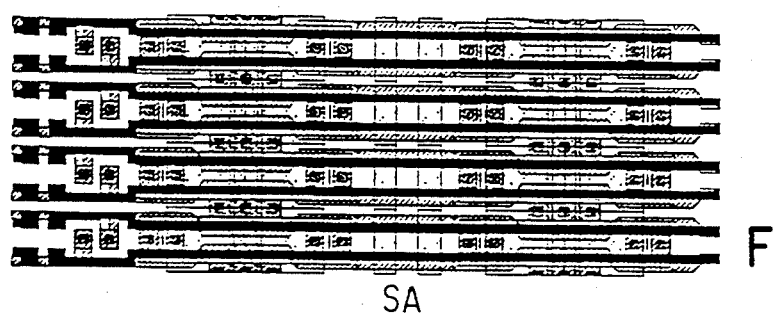
FIG. 21C
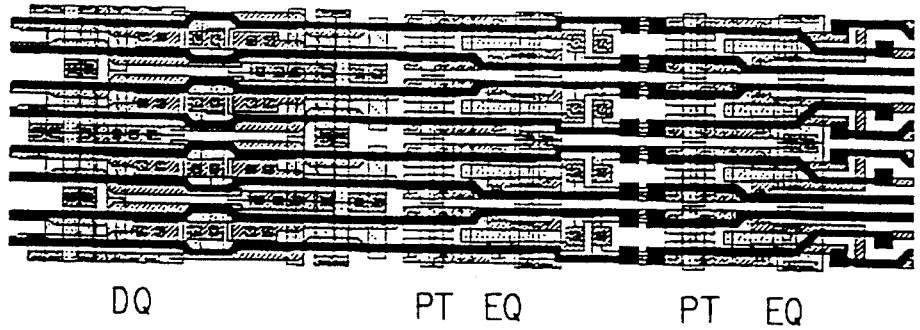
FIG. 21D

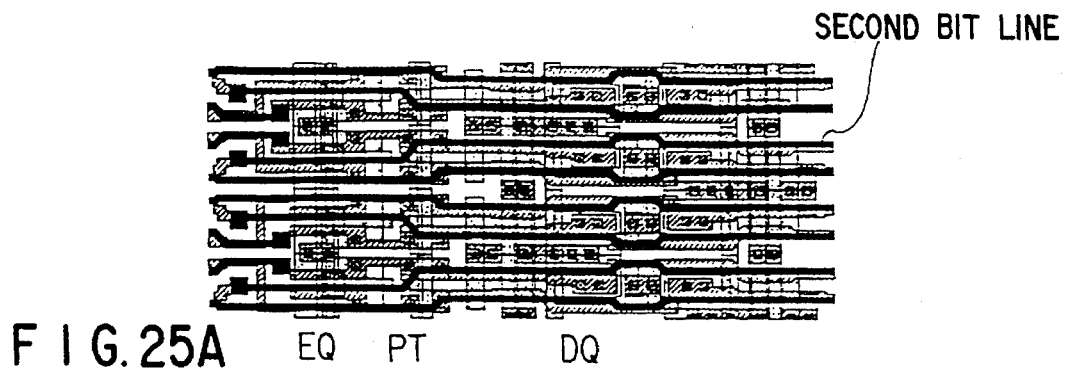
F I G. 25A  EQ  PT  DQ
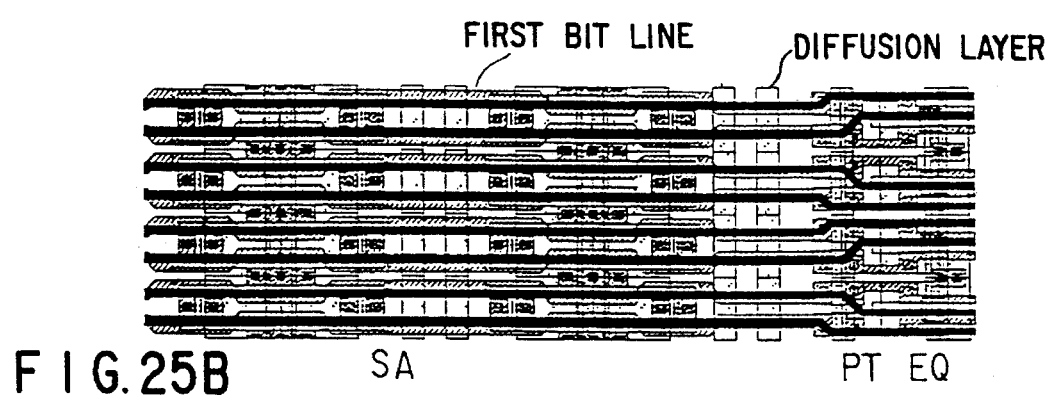
F I G. 25B  SA  PT EQ
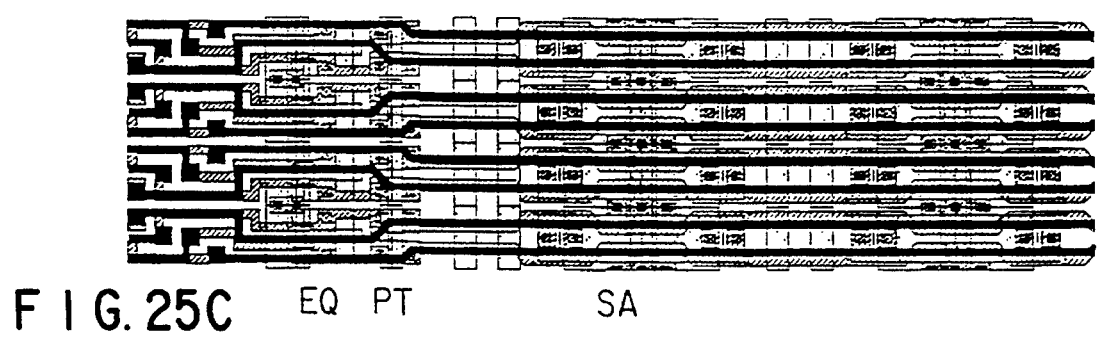
F I G. 25C  EQ PT  SA
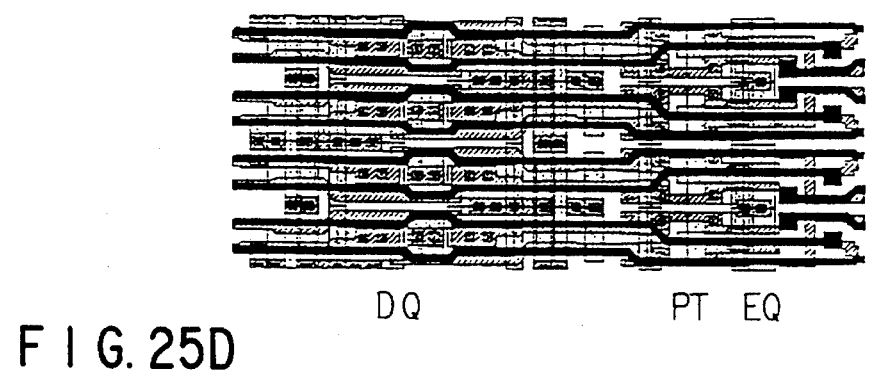
DQ  PT EQ
F I G. 25D

DYNAMIC SEMICONDUCTOR MEMORY DEVICE

BACKGROUND OF THE INVENTION

1. Field of the Invention

This invention relates to a dynamic semiconductor memory device.

2. Description of the Related Art

Dynamic semiconductor memory devices (hereinafter, referred to as DRAMs) with a one-transistor/one-capacitor memory-cell structure have recently had a much larger density as a result of improvements in the memory cell structure and advances in submicroscopic processing technology. The design rules for wires including bit lines and word lines, and transistors, have therefore been reduced. The method of arranging memory cells and sense amplifier blocks is one of the major design requirements that determine the area of a DRAM or its performance.

Already proposed methods of constructing a cell array containing memory cells and sense amplifier blocks will be explained briefly below.

For sense amplifier systems for DRAMs, an open bit-line architecture is used for up to 16 Kbits, and a folded bit line architecture is used for the generations of 16 Kbits to present 64-Mbits.

FIG. 1A shows a method of constructing a DRAM known as an open bit line architecture. Memory cells MC are arranged at all intersections where word lines WL cross bit lines BL. This arrangement maximizes the density of memory cells and is suitable for obtaining a chip with a small area. With this method, if the design minimum size is F, the theoretical cell area will be $4F^2$.

In a layout design of a sense amplifier block, sense amplifier blocks SA must be placed on a 1BL. pitch, making the design rules for sense amplifier blocks SA very strict. Because bit line pairs are in different cell arrays, noise generated in a cell array is introduced onto only one of the bit-line pair. Since the noise is difficult to cancel, the arrangement is less immune to noise. Furthermore, memory cells are connected to all of the intersections of bit lines and word lines and the bit-line capacity per word line is large, it is impossible to make the number of word lines very large. As a result, the number of sense amplifiers within the chip is large, thus preventing the chip size from being made smaller as expected.

FIG. 1B shows a method of constructing a DRAM known as a relax open bit line architecture. In this method, memory cells MC are placed at all intersections of word lines WL and bit lines BL with one sense amplifier block SA for every two BLs. The layout of the sense amplifier block SA is easier to design than by the open bit line architecture. The former, however, is not satisfactory. Furthermore, the relax open bit-line architecture is liable to noise as is the open bit-line architecture. In addition, it has a large bit-line capacity per word line.

FIG. 1C shows a method of constructing a DRAM known as a folded bit-line architecture. In this method, sense amplifier blocks SA are placed on a 4-BL pitch. Therefore, layout design of a DRAM is relatively easier to design than by the open bit-line architecture. Because in the folded bit line architecture, bit-line pairs are formed within a single cell array, noise generated within the array is introduced onto both of each pair, making the DRAM immune to noise.

With the folded bit-line architecture, if the minimum size is F, the area of a memory cell will be $8F^2$. Thus, the area of a memory cell is twice as large as that of the open bit-line architecture, resulting in an increase in the chip area.

As mentioned above, the design rules for sense amplifier blocks are less strict for the open bit-line architecture, the relax open bit-line architecture, and the folded bit line architecture in that order. The chip area is greater because of increasing the memory cell area. Namely, the design rules for sense amplifier blocks are made less strict by changing the sensing method, resulting in so much an increase in the chip area.

Additionally, with conventional DRAMs, the folded bit line architecture makes the DRAM more immune to noise, but cannot make the memory size smaller. In contrast, the open bit line architecture makes the memory size smaller, but cannot make the DRAM more immune to noise.

SUMMARY OF THE INVENTION

An object of the present invention is to provide a dynamic semiconductor memory device which enables a smaller memory cell size even with a folded bit-line architecture, and which allows a high density of memory cells and noise reduction.

Another object of the present invention is to provide a dynamic semiconductor memory device which loosens the design rules for sense amplifier blocks regardless of the sense method and which allows a high density of memory cells and noise reduction.

A dynamic semiconductor memory device according to a first aspect of the present invention, is characterized by comprising: first bit lines; second bit lines which are partially laminated above the first bit lines and form bit-line pairs together with the first bit lines, to build a folded bit-line structure; word lines arranged so as to cross the first bit lines and the second bit lines; and at least one memory cell array in which memory cells connected to the first bit lines and the second bit lines are arranged in a matrix, wherein the memory cell array includes a plurality of first areas in which memory cells are arranged, and second areas which are arranged so as to alternate with the first areas and contain no memory cell, and the second areas include areas where the first bit lines of the specified number of the bit-line pairs are connected to the second bit lines and the second bit lines are connected to the first bit lines. The second areas include: third areas where for half of the bit-line pairs, the first bit lines cross the second bit lines in three dimensions, and for the remaining half, the first bit lines are connected to the second bit lines, and the second bit lines are connected to the first bit lines; and fourth areas which are adjacent via the first areas to the third areas, where the first bit lines and the second bit lines of the bit-line pairs, for which the first bit lines are connected to the second bit lines and the second bit lines are connected to the first bit lines, cross each other in three dimensions, and for the remaining half of the bit-line pairs, the first bit lines are connected to the second bit lines and the second bit lines are connected to the first bit lines.

Another dynamic semiconductor memory device according to the first aspect of the present invention, is characterized by comprising: first bit lines; second bit lines which are partially laminated above the first bit lines and, together with the first bit lines, form bit-line pairs to build a folded bit-line structure; word lines arranged so as to cross the first bit lines and the second bit lines; and at least one memory cell array in which memory cells connected to the first bit lines and the second bit lines are arranged in a matrix, wherein the memory cell array includes first areas which are provided with memory cells, and second memory areas which are arranged so as to alternate with the first areas and contain no memory cell, the first bit lines and the second bit lines construct first bit line pairs which are crossed each other in three dimensions in a predetermined second area and second bit line pairs which are connected therein, and the first bit line pairs are connected and the second bit line pairs are crossed each other in three dimensions in a second area adjacent via the first area to the predetermined second area.

Preferred embodiments according to the first aspect of the invention are as follows.

(1) The above dynamic semiconductor memory device further comprises: transfer gates placed between the memory cells and the first bit lines and connected to the respective first bit lines; and third bit lines connected to the memory cells and connected to the first bit lines via the transfer gates.

(2) The dynamic semiconductor memory device still further comprises wires coupled to the first bit lines and the second bit lines, one end of each wire being connected via a first contact to the first bit line and the other end being connected via a second contact to the second bit line in the second area.

(3) In the above dynamic semiconductor memory device, the distance $P_1$ between one of the first and second contacts and the wire, if the width of and the spacing between the first bit lines and the width of and the spacing between the second bit lines are $L_1$, $S_1$, and $L_2$, $S_2$, respectively, fulfills $P_1=S_1$, $S_2$ and $S_1=<P_1<2S_1$ and $S_2=<P_1<2S_2$.

According to the first aspect of the invention, because memory cells are placed at all of the intersections of the first bit lines and the word lines, twice as many memory cells as those in the conventional folded bit-line architecture can be provided, thereby achieving as high a packing density of memory cells as that in the open bit-line architecture. Furthermore, because the second bit lines are provided above the narrower first bit lines with the shorter spacing between them, and the first and second bit lines which are paired are connected the inside of the array, noise can be reduced by combining the first bit lines and the second bit lines to form folded bit lines.

Since half of the bit-line pairs cross each other in three dimensions at a boundary portion where connections of the first and second bit lines are changed, and the remaining half cross each other in three dimensions at the next boundary, the design rules for the boundary portion can be relaxed. Furthermore, because the width of the first and second bit lines can be made narrower and the spacing between the first bit lines and between the second bid lines can be made shorter, a higher packing density can be achieved. In addition, by allowing the first bit lines to cross the second bit lines in three dimensions, noise between bit lines can be reduced more than twists in a conventional equivalent.

As described above, according to the first aspect of the invention, it is possible to realize a dynamic semiconductor memory device which enables a smaller memory size, a higher packing density of memory cells, and a reduction in noise even by the folded bit-line architecture.

The gist of a dynamic semiconductor memory device according to a second aspect of the invention is that the number of wiring layers used to wire the diffusion layers and gate electrodes of transistors within a sense amplifier block is increased, thereby allowing sense amplifier blocks to be arranged in columns, differently from a conventional cell array where only one column of sense amplifier blocks is provided along the word line, and that this arrangement eases the pitch along the word line in designing the layout of a sense amplifier block.

Specifically, a semiconductor memory device according to the second aspect of the present invention, is characterized by comprising: at least one memory cell array in which memory cells are arranged in a matrix; bit lines connected to the memory cells and used to read and write information from or into the memory cells; word lines provided so as to cross the bit lines and used to select a memory cell from which information is to be read onto the bit line; sense amplifier blocks which are connected to the bit lines and contain sense amplifiers for sensing and amplifying the information read from a memory cell onto the bit line, with at least two of the sense amplifiers being placed side by side along the bit line; and wires which connect the bit lines to the sense amplifier blocks to be connected to the bit lines by passing through sense amplifier blocks placed between the bit lines and the sense amplifier blocks, and wherein the wires are formed in a layer different from a layer in which the bit lines are formed.

Preferred embodiments according to the second aspect of the invention are as follows.

(1) In the above dynamic semiconductor memory device, the sense amplifier blocks have first and second nodes, are connected to the bit lines so as to form an open bit-line structure, with two of the sense amplifier blocks being placed side by side along the bit line, the first node being connected to one of a bit-line pair, and the second node being connected to the other of the bit-line pair via the wire.

(2) In the above dynamic semiconductor memory device, the sense amplifier blocks have first and second nodes, are connected to the bit lines so as to form a relax open bit-line structure, with two of the sense amplifier blocks being placed side by side along the bit line, the first node being connected to one of a bit-line pair, and the second node being connected to the other of the bit-line pair via the wire.

(3) In the above dynamic semiconductor memory device, the sense amplifier blocks are connected to the bit lines so as to form a folded bit-line structure, with two of the sense amplifier blocks being placed side by side along the bit line, the sense amplifier block closer to the cell array to be connected being directly connected to the bit line, and the sense amplifier block less close to the bit line to be connected being connected to the cell array via the wire.

According to the dynamic semiconductor memory device of the second aspect of the invention, wires in a different layer from a layer in which bit lines are formed are used, and the wires are allowed to pass through one sense amplifier block and are connected to the other sense amplifier. This connection enables these sense amplifier blocks to sense signals on the corresponding bit lines even if sense amplifier blocks (e.g., two sense amplifier blocks) are arranged side by side along the bit line. In this case, because sense amplifier blocks can be placed in an area in which twice as many bit lines as those in a conventional equivalent are provided, the pitch along the word line can be eased in designing the layout of a sense amplifier block.

In another dynamic semiconductor memory device according to the second aspect of the invention, the sense amplifier blocks are connected to the bit lines so as to form a folded bit-line structure, with two of the sense amplifier blocks being placed side by side along the bit line, the bit lines include first bit lines and second bit lines provided above the first bit lines, either the first bit lines or the second bit lines are used as passage wires for the sense amplifiers, and the other are used as wires for the sense amplifiers.

In the above dynamic semiconductor memory device, memory cell array includes first areas which are provided with memory cells, and second memory areas which are arranged so as to alternate with the first areas and contain no memory cell, and the second memory areas include areas where for a specified number of the bit-line pairs, the first bit lines are connected to the second bit lines and the second bit lines are connected to the first bit lines.

In the dynamic semiconductor memory device, second areas include: third areas where for half of the bit-line pairs, the first bit lines cross the second bit lines in three dimensions, and for the remaining half, the first bit lines are connected to the second bit lines, and the second bit lines are connected to the first bit lines; and fourth areas which are adjacent via the first areas to the third areas, where the first bit lines and the second bit lines of the bit-line pairs, for which the first bit lines are connected to the second bit lines and the second bit lines are connected to the first bit lines, cross each other in three dimensions, and for the remaining half of the bit-line pairs, the first bit lines are connected to the second bit lines and the second bit lines are connected to the first bit lines.

In the above dynamic semiconductor memory device, the memory cell array includes first areas which are provided with memory cells, and second memory areas which are arranged so as to alternate with the first areas and contain no memory cell, and the second memory areas include third areas where the first bit lines and the second bit lines of half of the bit-line pairs cross each other in three dimensions, and fourth areas where the first bit lines and the second bit lines of the bit line pairs of the remaining half of the second area cross each other in three dimensions in the third areas adjacent via the first areas.

In the above dynamic semiconductor memory device, the sense amplifiers contained in the sense amplifier blocks adjoining each other are placed side by side so as to share n-well regions for providing pMOS transistors arranged between the amplifier blocks.

According to another dynamic semiconductor memory device of the second aspect of the invention, bit lines are made up of two layers of wires, and one layer of bit lines is used as passage wires through one sense amplifier block. This arrangement enables sense amplifier blocks to be placed in an area in which twice as many bit lines as those in a conventional equivalent are provided, without providing additional wires. Therefore, it is possible to ease the pitch along the word line in designing the layout of a sense amplifier block.

As described above, according to the second aspect of the invention, the number of wiring layers used to wire the diffusion layers and gate electrodes of transistors within a sense amplifier block is increased, thereby allowing sense amplifier blocks to be arranged in columns, differently from a conventional cell array where only one column of sense amplifier blocks is provided along the word line. This arrangement can ease the pitch along the word line in designing the layout of a sense amplifier block. Therefore, the design rules for sense amplifiers can be loosened regardless of the sense method. As a result, it is possible to realize a dynamic semiconductor memory device which minimizes an increase in the chip area resulting from sense amplifiers regardless of cell array structure.

Furthermore, the dynamic semiconductor memory devices in relation to the first and second aspects of the invention can be combined, in which case, the effects of both aspects are obtained.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 12 shows the structure of a dynamic semiconductor memory device according to a second embodiment of the present invention;

FIGS. 21A to 21D show layouts of bit-line layers etc. in the seventh embodiment;

FIGS. 25A to 25D show layouts of bit-line layers etc. in the seventh embodiment;

DETAILED DESCRIPTION OF THE PREFERRED EMBODIMENTS

Hereinafter, referring to the accompanying drawings, embodiments of the present invention will be explained.

Figure 2:
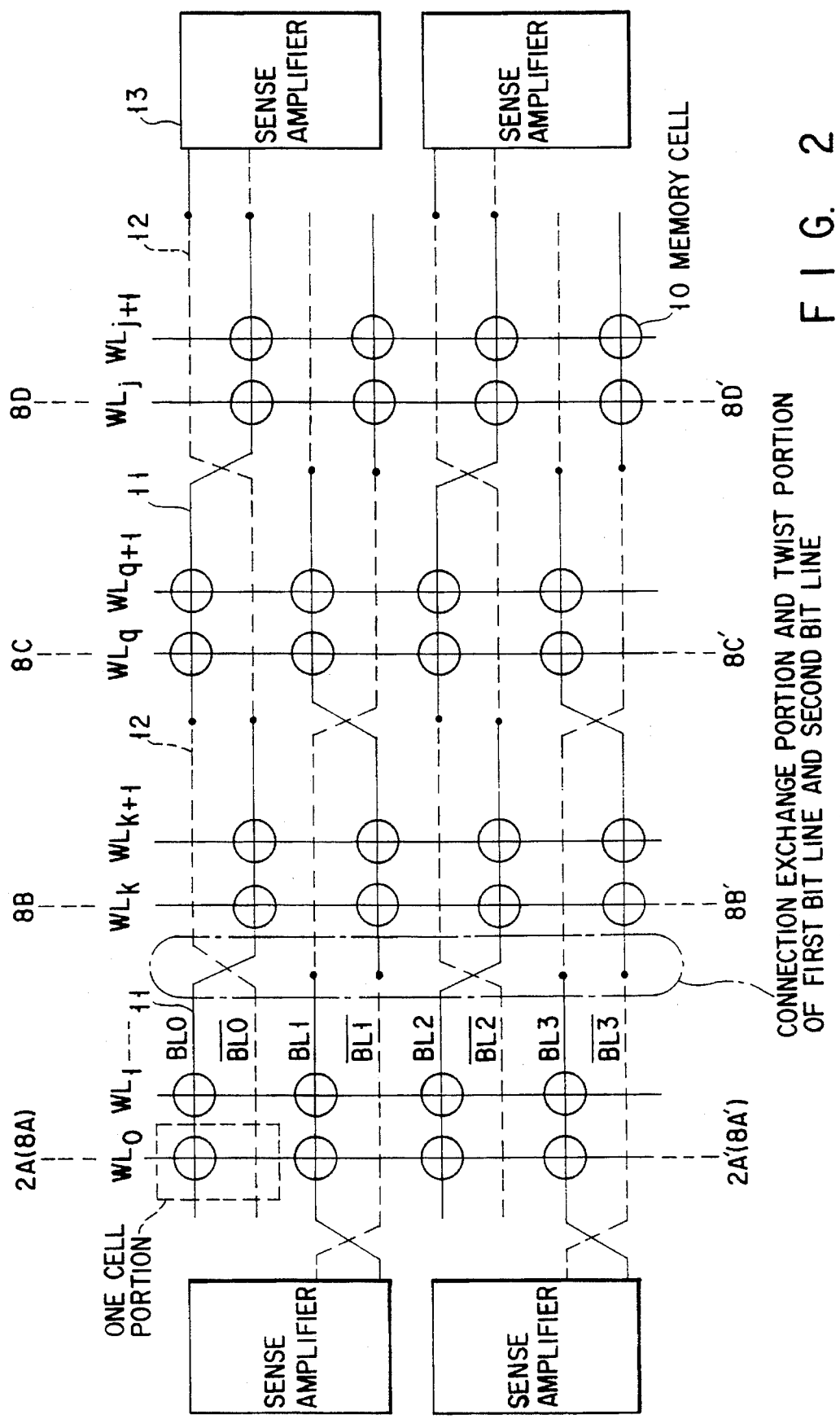
FIG. 2 shows the structure of a dynamic semiconductor memory device according to a first embodiment of the present invention.

FIG. 2 shows the structure of a dynamic semiconductor memory device (hereinafter, referred to as a DRAM) according to a first embodiment of the present invention.

Word lines WL ($WL_0$, $WL_1$, ...) are placed vertically, and first bit lines 11 indicated by solid lines are placed horizontally with respect to memory cells 10. Second bit lines 12 indicated by dotted lines are placed over the first bit lines 11. The first bit lines 11 and the second bit lines 12 form bit-line pairs, which are connected to right and left sense amplifiers 13 to form a DRAM using a folded bit-line architecture.

In FIG. 2, block marks indicate points at which connections of the first bit lines 11 and the second bit line 12 are changed. In the figure, the cell array is broadly divided into four parts. For instance, on the left half of the array, $BL_0$ is connected to the first bit line 11, and on the right half, it is connected to the second bit line 12. In contrast, on the left half, $/BL_0$ is connected to the second bit line 12 as a passage bit line, and on the right half, it is connected to the first bit line 11 connected to memory cells. The $BL_0$ and $/BL_0$ form a folded bit-line pair, which is connected to the sense amplifier 13.

As described above, use of the first bit line 11 and the second bit line 12 enables the data in the memory cell to be read onto only $BL_0$, not $/BL_0$, when word line $WL_0$ is selected, for example. Because this is done by the folded bit-line architecture, array noise is reduced remarkably as compared with the open bit-line architecture. This helps to reduce the bit-line capacity per word line, which increases the number of word lines connected to the sense amplifier 13, for bit line pairs, thereby making the chip size smaller.

Since in the first embodiment, memory cells are placed at all intersections of the word lines and the first bit lines 11 differently from the folded bit-line architecture with a single layer of bit lines (e.g., the second bit line 12 is removed from FIG. 2), the memory cell size can be made half that of the folded bit-line architecture, or equal to that of the open bit-line architecture.

The width of the first bit lines 11 and the spacing between them can be made the narrower value determined in the manufacturing technics. At the boundary of the quadrisected array, for the half of the bit line pairs, the first bit lines 11 are switched to the second bit lines 12 or vice versa, and for the remaining half, the first bit lines 11 cross the second bit lines 12 in three dimensions. This minimizes the width of the first and second bit lines and the spacing between the first bit lines and between the second bit lines in the memory cell array, as explained later. Furthermore, coupling noise between bit lines in the folded bit-line architecture can be reduced more than the conventional twists in bit lines.

Figure 3:
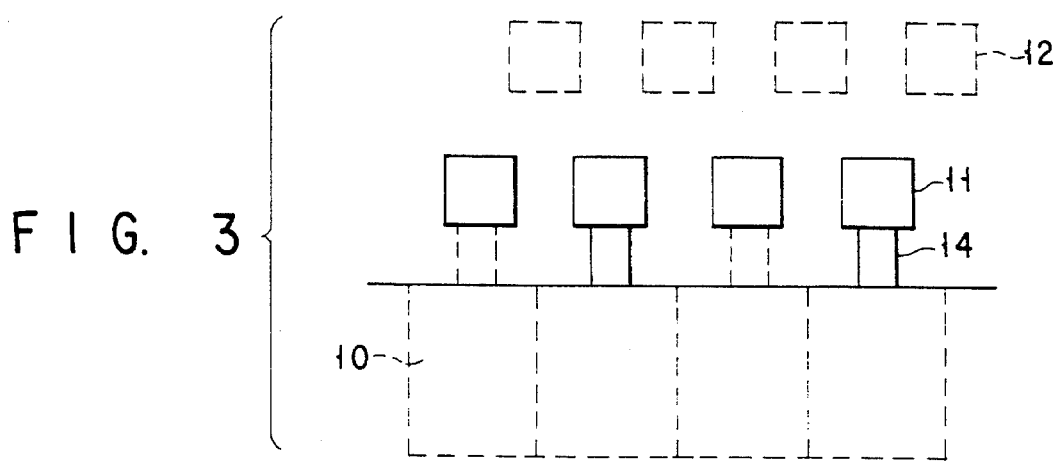
FIG. 3 is a sectional view taken along line 2A (8A) to 2A' (8A)'.

FIG. 3 is a sectional view taken along line 2A (8A) to 2A' (8A)' of FIG. 2. The memory cells 10 are connected to the first bit lines 11 by means of bit line direct contacts 14. Above between the first bit lines 11, the second bit lines 12 are formed.

Figure 4:
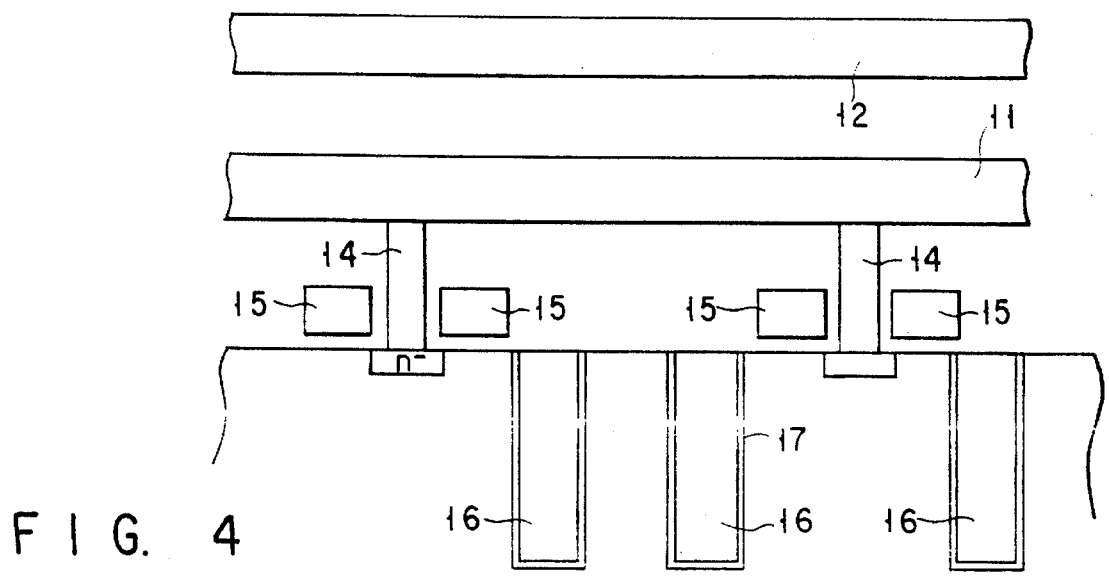
FIG. 4 is a sectional view of memory cells used.

FIG. 4 shows memory cells applicable to the first embodiment. At the surface of a substrate, MOS transistors serving as transfer gates are formed. Trenches 16 formed in the substrate are provided with capacitors 17. The gate of a MOS transistor 15 is a word line WL, its source is connected to a capacitor 17, and its drain is connected to a first bit line 11.

Figure 6:
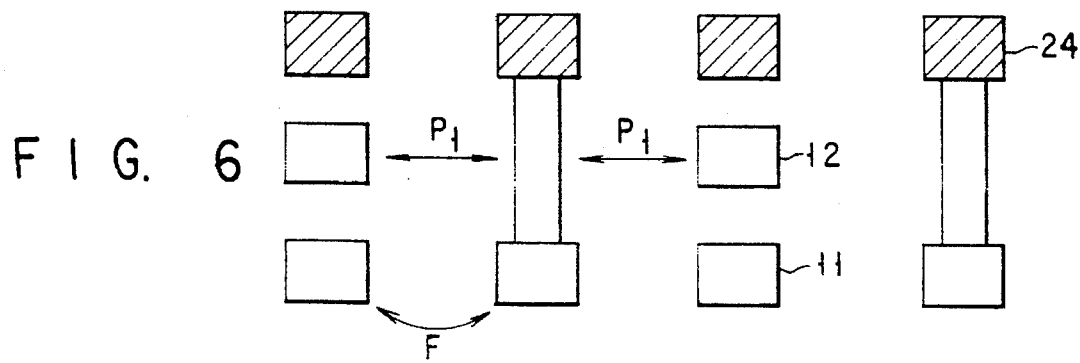
FIG. 6 is a sectional view taken along line 6E-6E' of FIG. 5.
Figure 5:
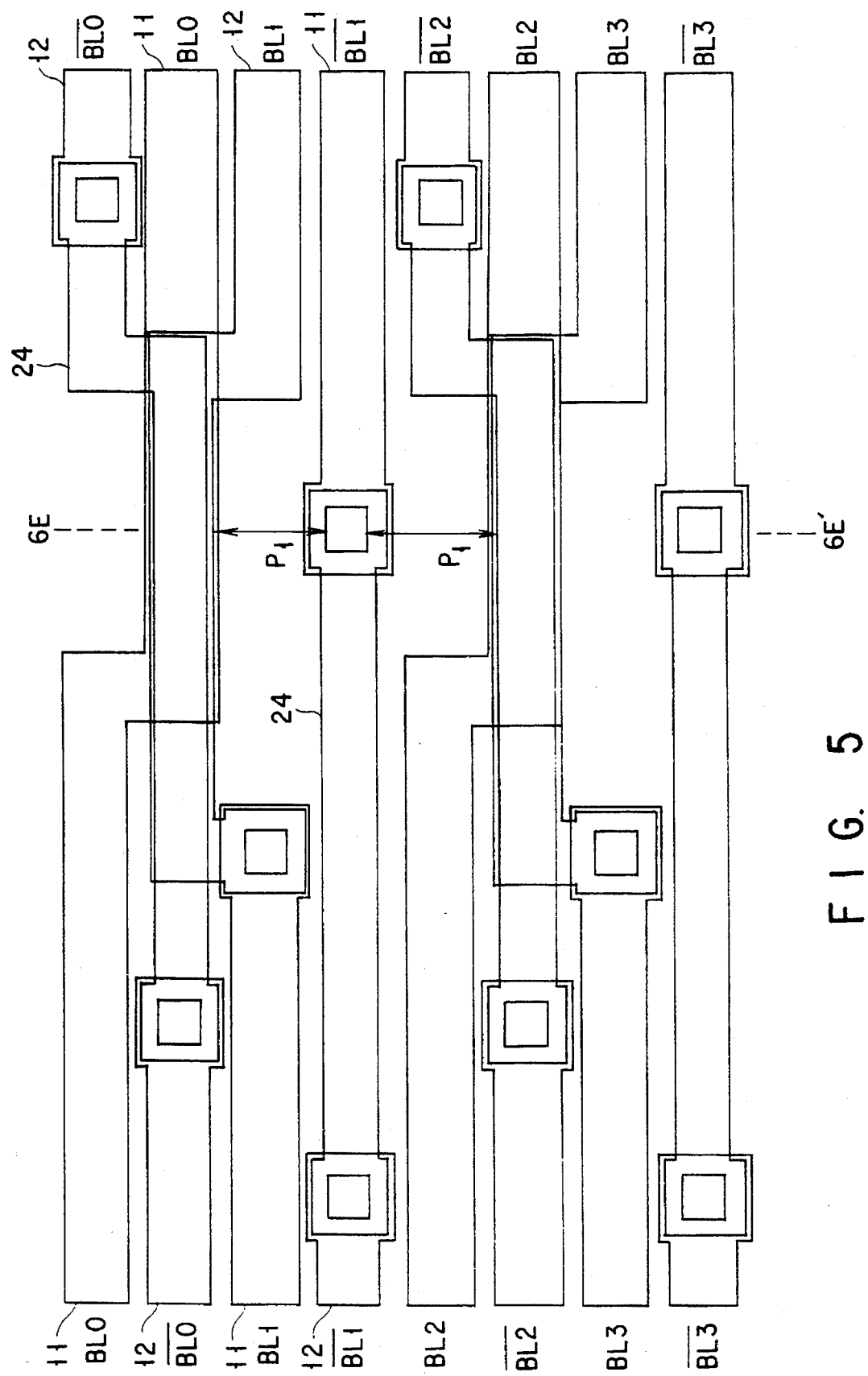
FIG. 5 shows a layout of the connection change portions and twist portions of first and second bit lines in the first embodiment.

FIG. 5 shows the portion enclosed by a single-dot-dash line of FIG. 2, or a layout of the connection change portion of the first bit lines 11 and the second bit lines 12 and the twist portion. FIG. 6 is a sectional view taken along line 6E-6E' of FIG. 5. In this layout, besides the first and second wires, (the first bit lines 11 and the second bit lines 12), fourth wires 24 are added.

Among the second bit lines 12 entering from the left, $/BL_0$ is switched to the fourth wire 24 once to return to the second bit line 12. It then crosses $BL_0$ acting as the first bit line 11 in the middle in three dimensions. Among the first bit lines 11 entering from the left, $BL_1$ is switched from the first bit line 11 to the second bit line 12. Among the second bit lines 12, $/BL_1$ uses the fourth wire 24 to switch from the second bit line 12 to the first bit line 11.

As described above, through multi-level crossing of $BL_0$ and $/BL_0$ and switching of $BL_1$ and $/BL_1$, half of the bit lines are crossed in three dimensions, thereby reducing the number of connections changed. In addition, use of the fourth wires 24 can widen the distance between the contact at the connection change portion and the contact support and other wires up to the basic rule (F) for the spacing between wires. That is, in FIG. 5, $P_1=F$.

For contacts in a conventional method, when $P_1=F$, if the contact size F and line width of wires L is F, then this will give spacing between wires S: S=F+F+F=3F. Thus, it is difficult to fulfill L<=S<2L. It is also difficult to make $P_1$ equal to S (i.e., to meet S=<$P_1$). As described above, in this embodiment, the pattern arrangement at the boundary portion enables the width of the first and second bit lines and the spacing between them to be reduced to the minimum rules, thereby making the memory cell array smaller.

Figure 7:
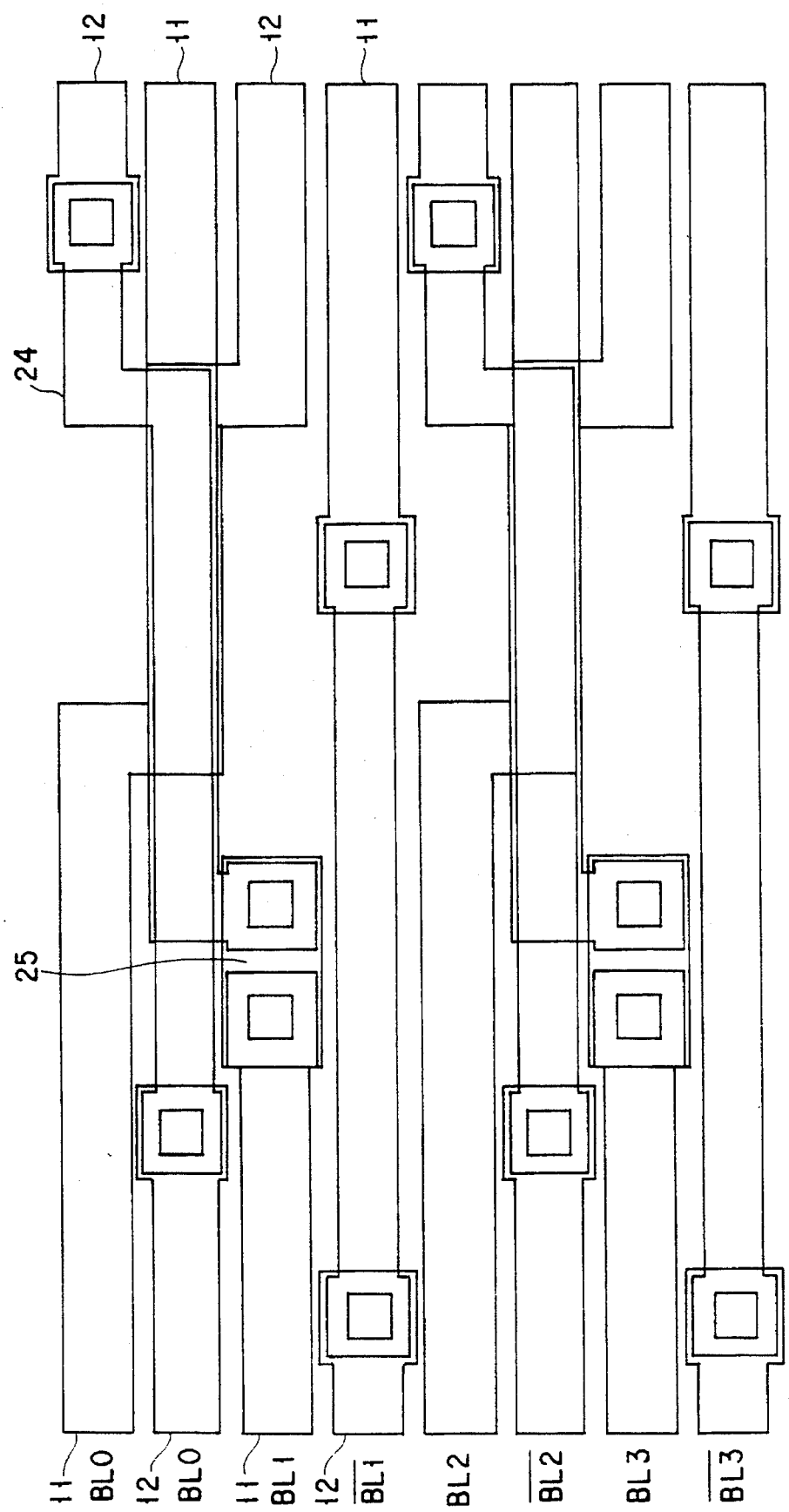
FIG. 7 shows another layout of the connection change portions and twist portions of first and second bit lines in the first embodiment.
Figure 8A:
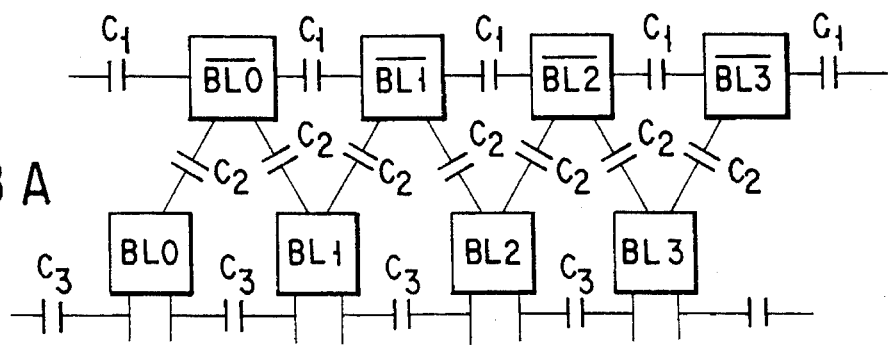
FIGS. 8A to 8D show the coupling capacity between bit lines in the first embodiment.
Figure 8B:
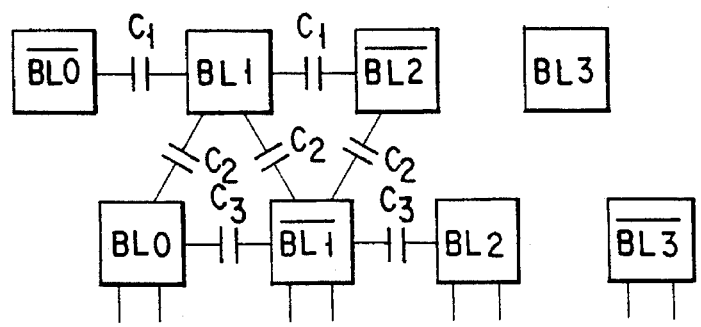
Figure 8C:
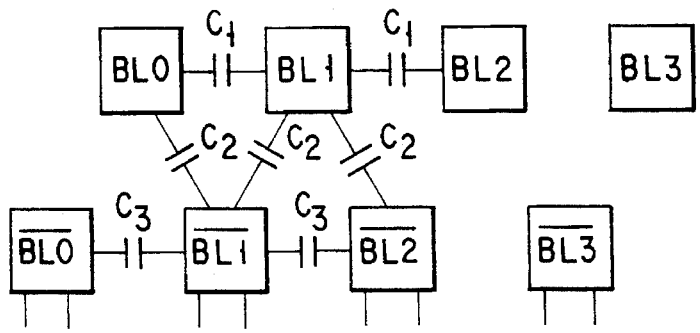
Figure 8D:
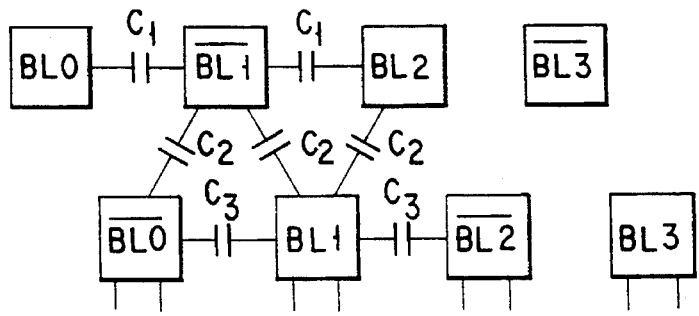

FIG. 7 shows another layout of the boundary, where the first bit lines 11 make no direct contact with the second bit lines 12. In this case, as shown in FIG. 7, use of fifth wires 25 allows the first bit lines 11 to be switched to the fifth wires 25 and then return to the second bit lines 12.

FIGS. 8A to 8D show coupling between bit lines when the first and second bit lines are crossed in three dimensions as shown in FIG. 2. FIGS. 8A, 8B, 8C, and 8D are sectional views taken along line 2A (8A) to 2A' (8A), line 8B-8B', line 8C-8C', and 8D-8D', respectively.

If the capacity between lower first bit lines (one fourth of the quadrisected array) is $C_3$, the capacity between upper second bit lines is $C_1$, and the capacity between the upper and lower bit lines is $C_2$, the capacity of each of the four portions is shown in FIGS. 8A to 8D. Explanation will proceed, centering on a pair of bit lines $BL_1$ and $/BL_1$.

Figure 9:
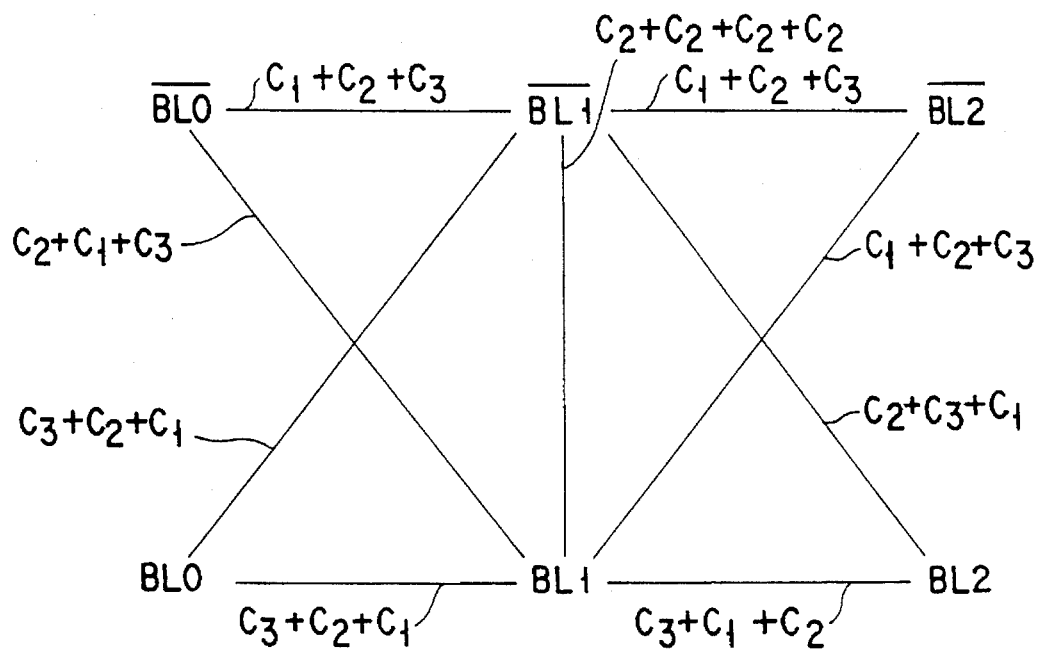
FIG. 9 is an overall view of the coupling capacity between bit lines.

Crossing bit lines in three dimensions gives the total capacity between bit lines as shown in FIG. 9. The coupling of the other bit lines $BL_2$, $/BL_2$, $BL_0$, $/BL_0$ with each of bit line pair $BL_1$, $/BL_1$ amounts to $C_1+C_2+C_3$. Since $BL_1$ and $/BL_1$ are affected by noise due to the same coupling, these coupling noises are all canceled when the voltage difference between $BL_1$ and $/BL_1$ is read by a sense amplifier.

Therefore, the remaining noise comes from only the coupling capacity $4C_2$ between $BL_1$ and $/BL_1$, thereby reducing noise remarkably. For twists in conventional bit lines, because the capacity $C_1$ between bit line pair $BL_a$ and $/BL_a$ is equal to the capacity $C_2$ between the other bit lines ($C_1=C_2$), twisting bit lines only reduces coupling noise, and consequently, noise is just halved. With the present invention, however, large capacitances $C_3$ and $C_2$ including the capacitance between contact supports for memory cells are all canceled, only leaving small capacitance $C_1$ (this capacitance can be made smaller by making larger the distance between the first and the second bit lines), thereby reducing noise remarkably.

Figure 10:
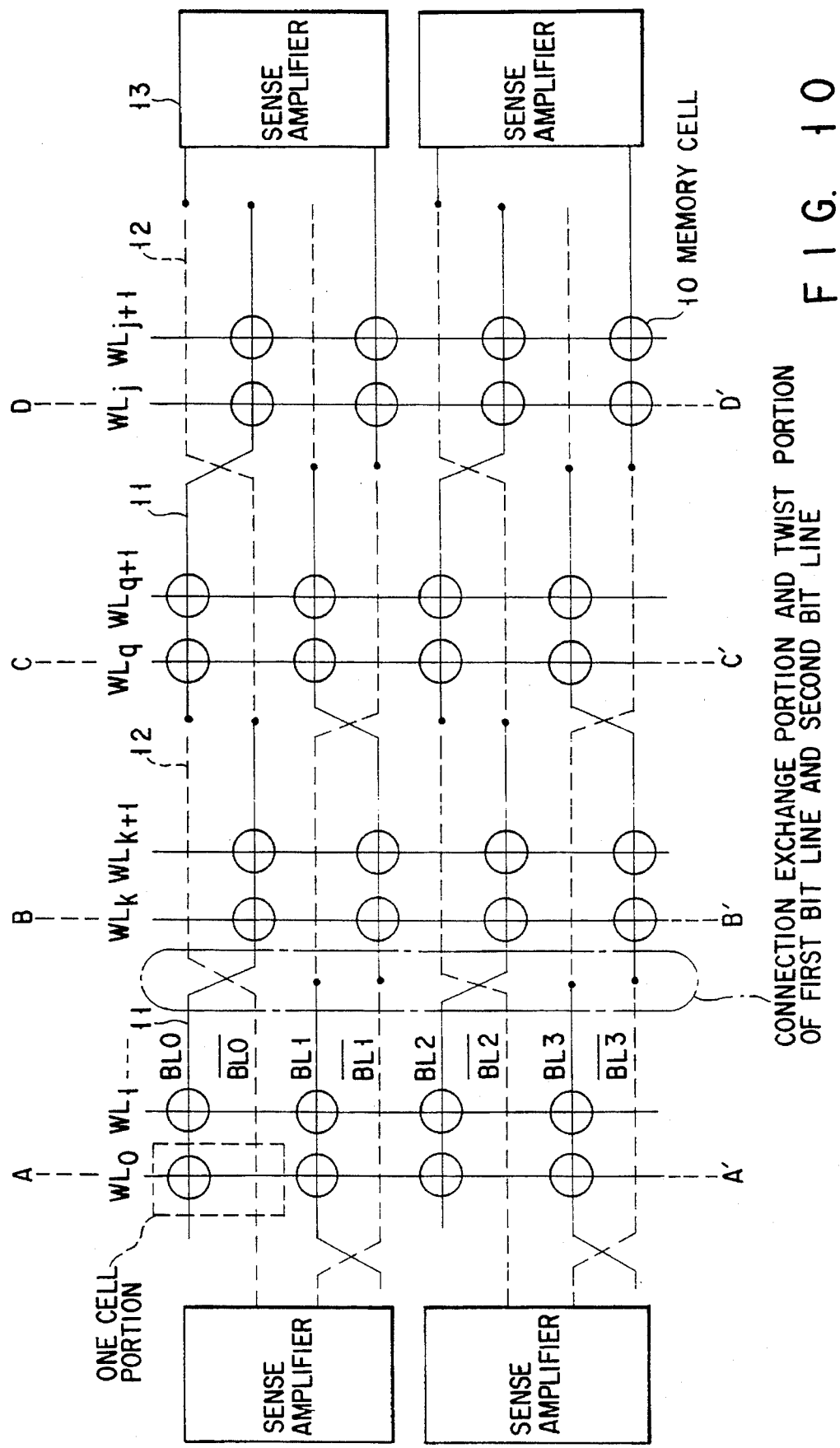
FIG. 10 is a view of a modification of the first embodiment.
Figure 11:
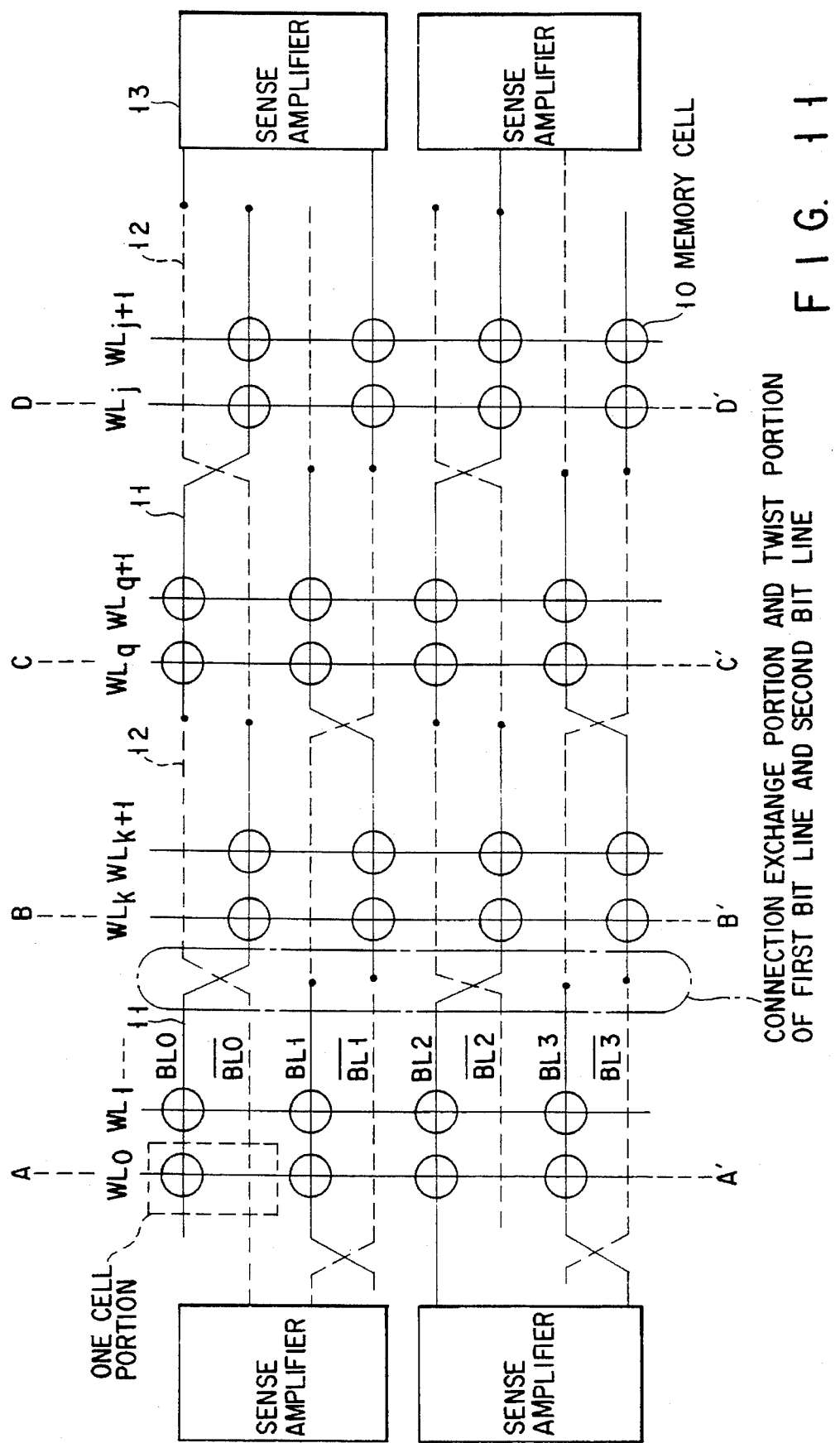
FIG. 11 is a view of another modification of the first embodiment.

FIGS. 10 and 11 show a first and a second modification of the first embodiment, respectively. In FIGS. 10 and 11, the same parts as those in FIG. 2, are indicated by the same reference symbols, and their detailed explanation will be omitted. The first and second modifications differ from what is shown in FIG. 2 in the connections of the sense amplifiers 13. Even when the connections of the sense amplifiers 13 are changed in this way, the first bit lines 11 and the second bit lines 12 form pairs and constitute a folded bit line architecture as mentioned earlier.

This arrangement enables noise in bit line pairs to be canceled, thereby reducing noise on the whole, although noise due to causes other than bit line pairs still remains.

As described above, with the first embodiment, as many memory cells as twice those used in the conventional folded bit line architecture where memory cells are at the intersections of bit lines and word lines can be placed, thereby making the density of memory cells as high as that in the open bit line architecture. Because the second bit lines 12 are placed above the narrower first bit lines 11 with the shorter spacing between them, and the first bit lines 11 are switched to the second bit lines 12 in the middle of the array, the first bit lines 11 and the second bit lines 12 can form folded bit lines, thereby reducing noise remarkably. At the region where the first bit lines are switched to the second bit lines, for half of the bit line pairs, the first bit lines are switched to the second bit lines, and the second bit lines are switched to the first bit lines, and the remaining half are crossed in three dimensions. This makes the design rules at the region less strict, which makes the width of the first bit lines 11 and the second bit lines 12 narrower and the spacing between the former and between the latter shorter, thereby achieving a high density. Crossing the first and second bit lines in three dimensions enables noise between bit lines to be reduced more than in the conventional twists in bit lines.

FIG. 12 shows the structure of a DRAM according to a second embodiment of the present invention. The same parts as those in FIG. 2 are indicated by the same reference symbols, and their detailed explanation will be omitted.

The second embodiment differs from the first embodiment in that third bit lines 23 directly connected to the memory cells 10 are added. While in the first embodiment, the memory cells 10 are directly connected to the first bit line 11, in the second embodiment, a plurality of third bit lines 23 are connected to the first bit lines 11 of the quadrisected memory cell array via block select transistors 27. Furthermore, the memory cells 10 are directly connected to these third bit lines 23.

Figure 13:
FIG. 13 is a sectional view taken along line 13F-13F' of FIG. 12.
Figure 13:
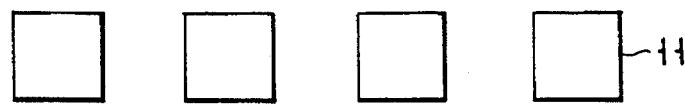
Figure 13:
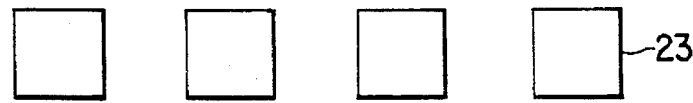

FIG. 13 is a sectional view taken along line 13F-13F' of FIG. 12. FIG. 13 shows a three-layer bit-line structure in which above the third bit lines 23 are the first bit lines, above which the second bit lines 12 are.

With such a configuration, when word line $WL_0$ is selected, for example, block select line $SWL_0$ is also selected, thereby allowing the data in the memory cell to be read onto $BL_0$ of the bit-line pair $BL_0$, $/BL_0$. Therefore, this is a folded bit-line architecture. At this time, because the block select lines for the memory cells except for the selected one are off (i.e., they have nothing to do with the first bit lines 11 and the second bit lines 12), the total bit-line capacity is small.

Therefore, the second embodiment can further increase the number of word lines within one cell array, as compared with the first embodiment, and consequently make the number of the sense amplifiers fewer, thereby reducing the chip size. The other things including the crossing of bit lines produce the same results as they do in the first embodiment. Because the second embodiment organizes conventional open cells into a folded bit-line structure, this can reduce noise while making the chip area smaller.

Figure 14:
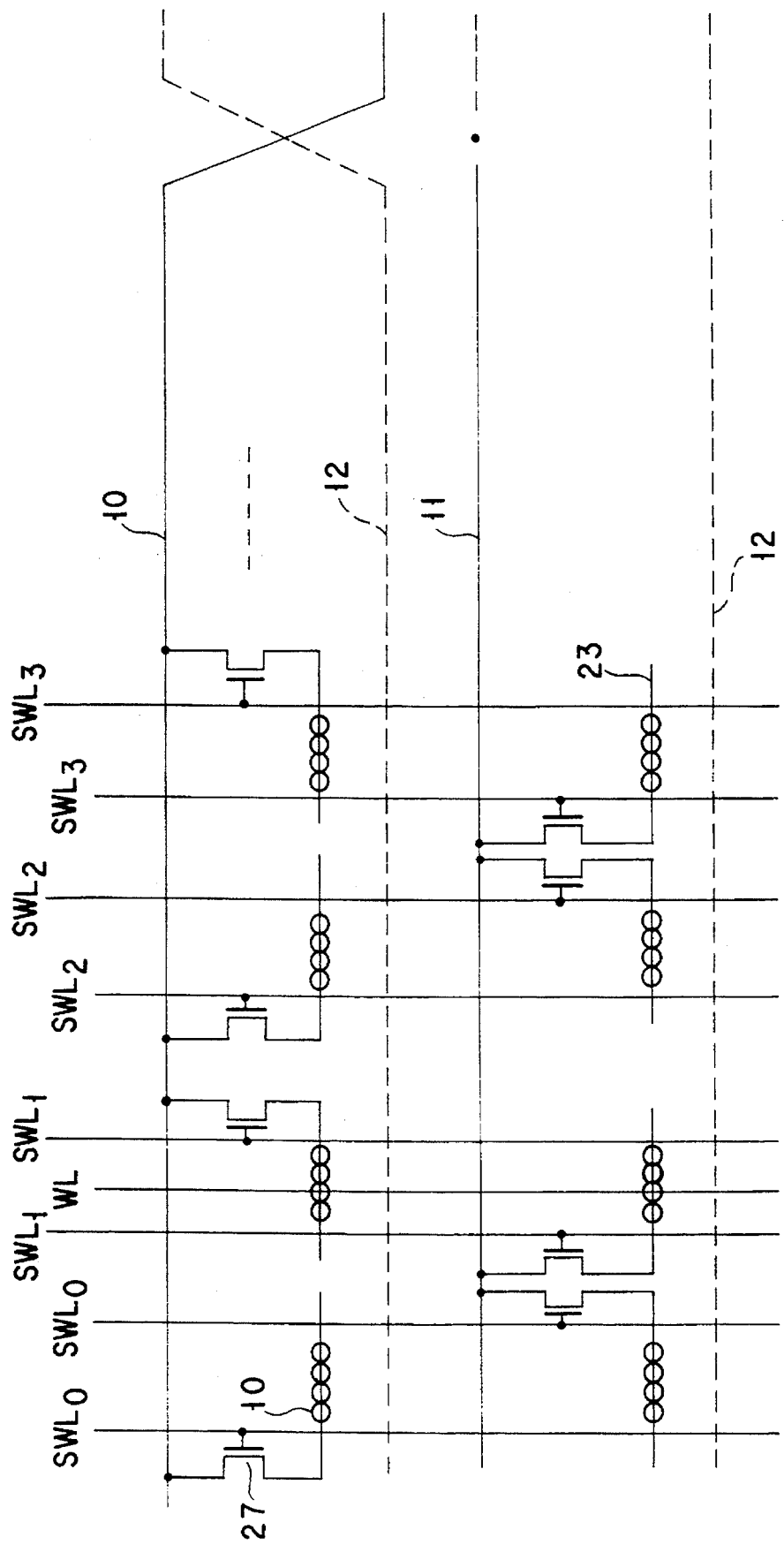
FIG. 14 shows the structure of a dynamic semiconductor memory device according to a third embodiment of the present invention.

FIG. 14 shows the structure of a DRAM according to a third embodiment of the present invention, which is a modification of the block select lines (SWL) in the second embodiment. While in FIG. 12, third bit lines 23 are connected to both sides of the drain of a block select transistor 27, in FIG. 14, a third bit line 23 is connected to only one side of the drain.

The above configuration also produces the same results as does the second embodiment. Although in the third embodiment, the number of the block select transistors increases, it has the advantage of being able to use in the case where cascade transistors are not used and making the design rules less strict because there is no block selective transistor in adjacent bit-line pairs.

Figure 15:
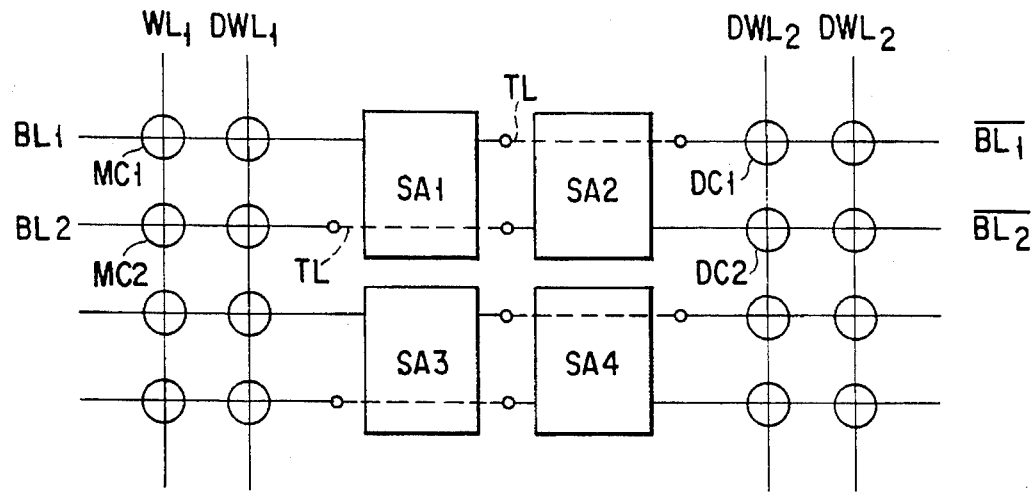
FIG. 15 shows the structure of the cell array section in a dynamic semiconductor memory device according to a fourth embodiment of the present invention.

FIG. 15 shows the structure of the cell array section in a DRAM according to a fourth embodiment of the present invention. A plurality of memory cells MC (MC1, MC2, . . . ) are arranged in a matrix and a plurality of bit lines BL (BL1, BL2, . . . ) for exchanging informational charges with the memory cells are placed in parallel. A plurality of word lines WL (WL1, WL2, . . . ) for selecting a memory cell are placed in parallel in the direction perpendicular to bit lines BL.

The memory cell MC has a known one-transistor/one-capacitor structure. The bit-line structure corresponding to the cell array is the open bit line type. Namely, memory cells MC are placed at all of the intersections of bit lines BL and word lines WL.

When word line WL (WL1, WL2, . . . ) is selected, dummy word line DWL (DWL1, DWL2, . . . ) and dummy cell DC (DC1, DC2, . . . ) selected in the same way, are in the cell array on the opposite side of sense amplifier block SA in the middle. For example, when word line WL1 is selected, dummy word line DWL2 is selected. Each dummy cell DC exchanges charge with bit line /BL (/BL1, /BL2, . . . ).

Sense amplifier block SA1 corresponding to BL1, /BL1 and sense amplifier block SA2 corresponding to BL2, /BL2 are arranged side by side along the bit line. BL2 is connected to another wiring layer TL not used within SA1, then passes through SA1, and is connected to SA2. Similarly, /BL1 is connected to another wiring layer TL not used within SA2, then passes through SA2, and is connected to SA1.

The passage wires TL have only to be formed in a layer different from BL and /BL. For instance, an additional wiring layer may be formed above the original bit lines and used as TL.

With the fourth embodiment, by using the passage wires TL in a different layer from that of the bit lines, the sense amplifier blocks SA can be placed side by side along the bit line. In this state, a sense operation can be carried out in the same manner as the normal open bit-line architecture. In this case, because sense amplifier blocks SA are arranged on a 2BL pitch along the word line, the pitch of sense amplifier blocks along the word line can be made twice as large as that in the conventional open bit-line architecture, increasing the flexibility of sense amplifier design remarkably.

Figure 1A:
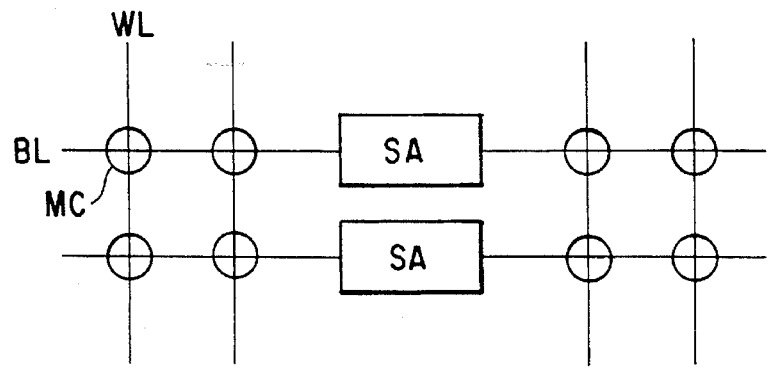
FIGS. 1A to 1C show the structure of the cell array section in conventional dynamic semiconductor memory devices.
Figure 1B:
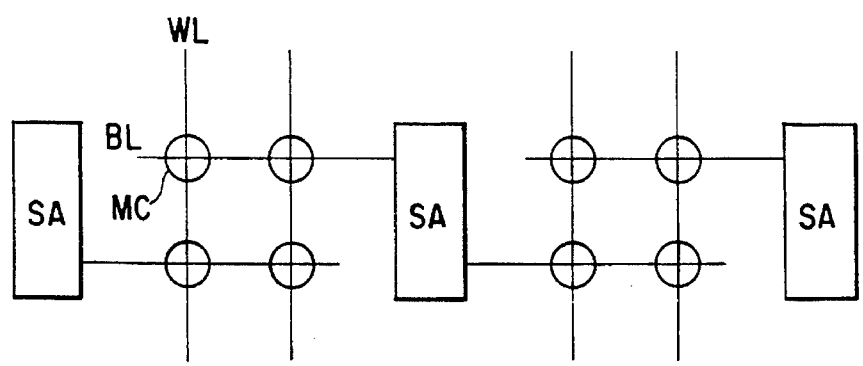
Figure 16:
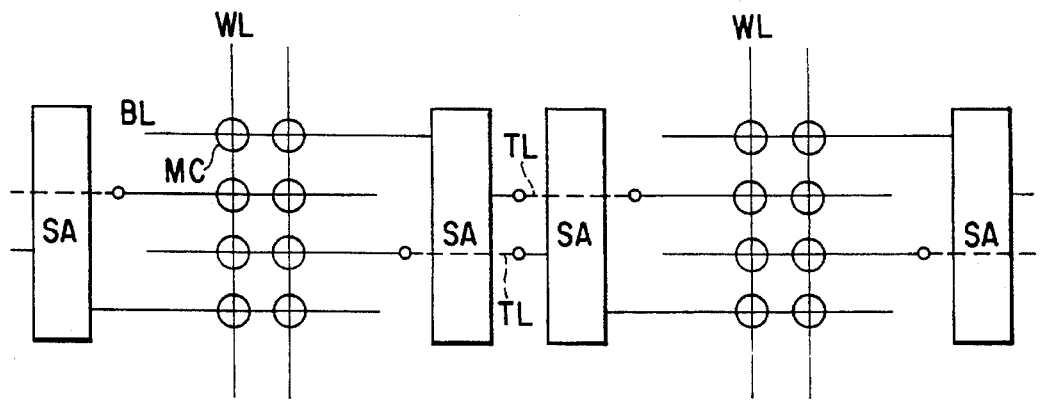
FIG. 16 shows the structure of the cell array section in a dynamic semiconductor memory device according to a fifth embodiment of the present invention.

FIG. 16 shows the structure of the cell array section of a DRAM according to a fifth embodiment of the present invention. In the fifth embodiment, the invention is applied to a cell array using a relax open bit-line architecture shown in FIG. 1B.

In the fifth embodiment, the pitch of sense amplifiers SA is made twice as large as that in a conventional equivalent, enabling the layout design with a 4BL pitch. Therefore, the sense amplifier design rules can be made less strict than that for the conventional relax open bit-line architecture.

Figure 1C:
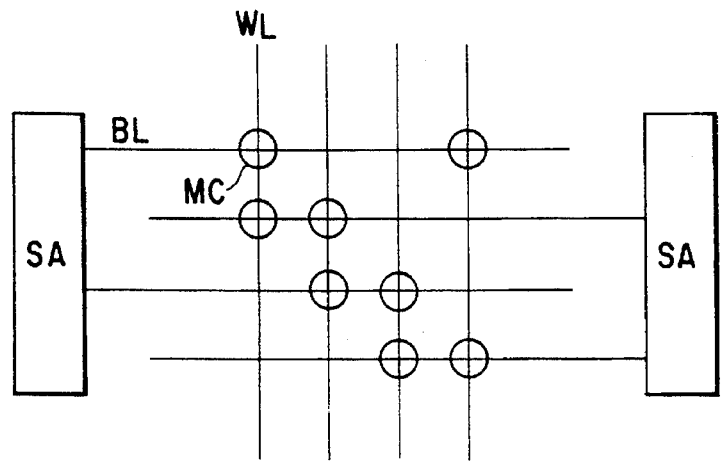
Figure 17:
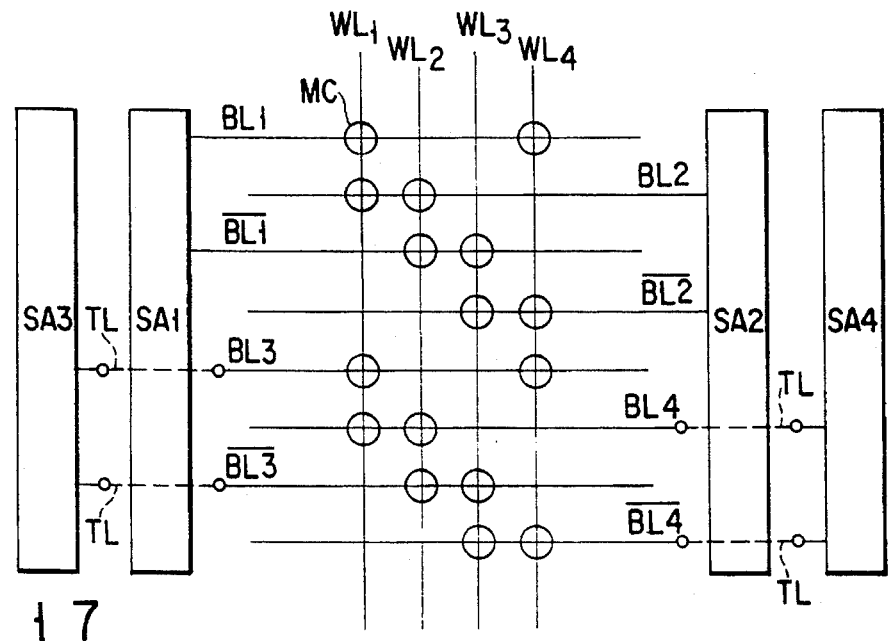
FIG. 17 shows the structure of the cell array section in a dynamic semiconductor memory device according to a sixth embodiment of the present invention.

FIG. 17 shows the structure of the cell array section of a DRAM according to a sixth embodiment of the present invention. In the sixth embodiment, the invention is applied to a cell array using a folded bit-line architecture shown in FIG. 1C.

In the sixth embodiment, two sense amplifier blocks SA (SA1 to SA4) are placed side by side on each side of the cell array. The arrangement of the left-side sense amplifiers will be explained. The sense amplifier block SA1 closer to the cell array is directly connected to bit line pair BL1, /BL1. The sense amplifier block less close to the cell array is connected to bit line pair BL3, /BL3 via wire TL passing through SA1. The arrangement of the right-side sense amplifiers is basically the same. The arrangement of memory cells is the same as that in the normal folded bit-line architecture, where each memory cell MC is provided on only one of each bit line pair for each word line.

With the sixth embodiment, the pitch of sense amplifier blocks SA is made twice as large as that in a conventional equivalent, enabling the layout design with a 8BL pitch. Therefore, the sense amplifier design rules can be made less strict than that for the conventional folded bit-line architecture.

Figure 18:
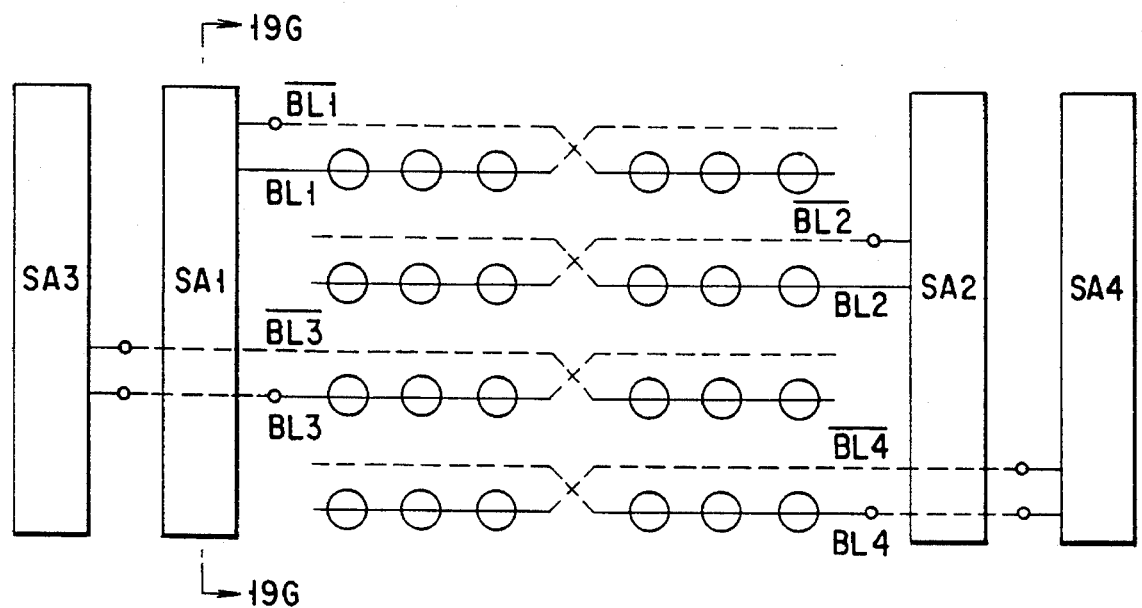
FIG. 18 shows the structure of the cell array section in a dynamic semiconductor memory device according to a seventh embodiment of the present invention.

FIG. 18 shows the structure of the cell array section of a DRAM according to a seventh embodiment of the present invention. In the seventh embodiment, the invention is applied to a cell array with two layers of bit lines using the folded bit-line architecture of the second aspect of the invention.

Figure 19:
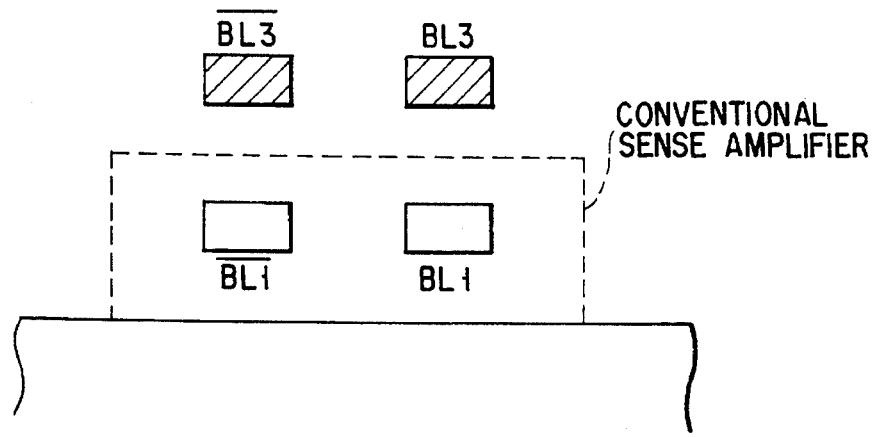
FIG. 19 is a sectional view of the sense amplifier section used in the seventh embodiment.

While in the fourth to sixth embodiments, only the sense amplifier section uses a new wiring layer, the seventh embodiment is characterized in that two types of bit lines BL in different layers are used. FIG. 19 is a sectional view of the sense amplifier section taken along line 19G-19G' of FIG. 18. Above a pair of BL, another pair of BL passes.

In the seventh embodiment, with the lower-layer wires indicated by solid lines BL and the upper-layer wire indicated by broken lines, memory cells MC are connected to the lower-layer wires. A pair of an upper-layer wire and a lower-layer wire forms a bit-line pair and thereby forming a folded bit-line architecture. Connection change points are provided at regular intervals on the upper-layer and the lower-layer wires. At the points, the upper-layer wires are allowed to cross the lower-layer wires. This is done in order to reduce coupling noise between bit lines in the folded bit-line architecture.

With the arrangement of the seventh embodiment, the area of the memory cell can be made $4F^2$. A two-layer structure of bit lines enables a folded bit line architecture. Sense amplifier blocks SA are arranged as shown in FIG. 19 in the same manner as the sixth embodiment.

Differently from the folded bit line architecture with a single layer of bit lines, the seventh embodiment allows memory cells MC to be placed at all of the intersections of the word lines and the lower bit lines with the upper bit lines removed in FIG. 18, for example. Therefore, the memory size can be made half that of the folded bit line architecture, or equal to that of the open bit-line architecture. Accordingly, it is possible to make the sense amplifier design rules less strict and the chip area smaller.

Figure 20:
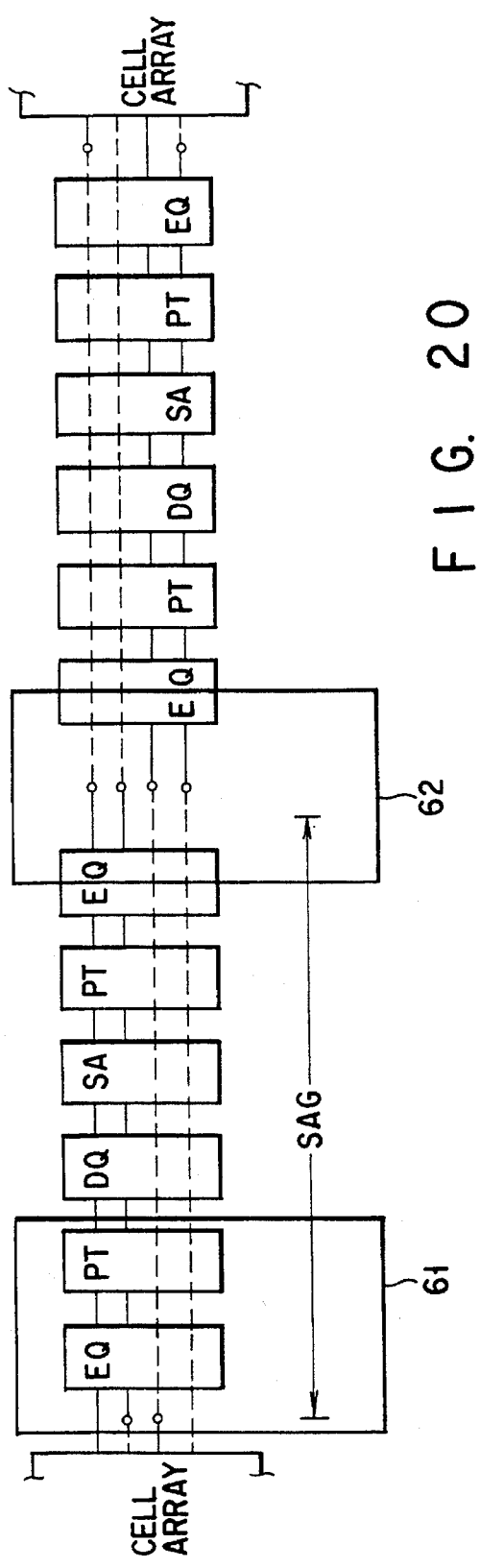
FIG. 20 shows the structure of the sense amplifier section used in the seventh embodiment.

FIG. 20 shows a structure of the sense amplifier section SA in the seventh embodiment. FIGS. 21A to 21D show layouts of bit-line layers etc. In general, a sense amplifier block in a DRAM comprises an equalizer circuit EQ for equalizing BL and /BL to precharge them to a constant voltage, a transfer gate PT for selecting a memory cell array to which the sense amplifier is connected, a sense amplifier circuit SA for sensing and amplifying the information in the memory cell placed on a bit line, and a data transfer circuit DQ for transferring the amplified signal from the sense amplifier to outside the cell array.

Figure 22:
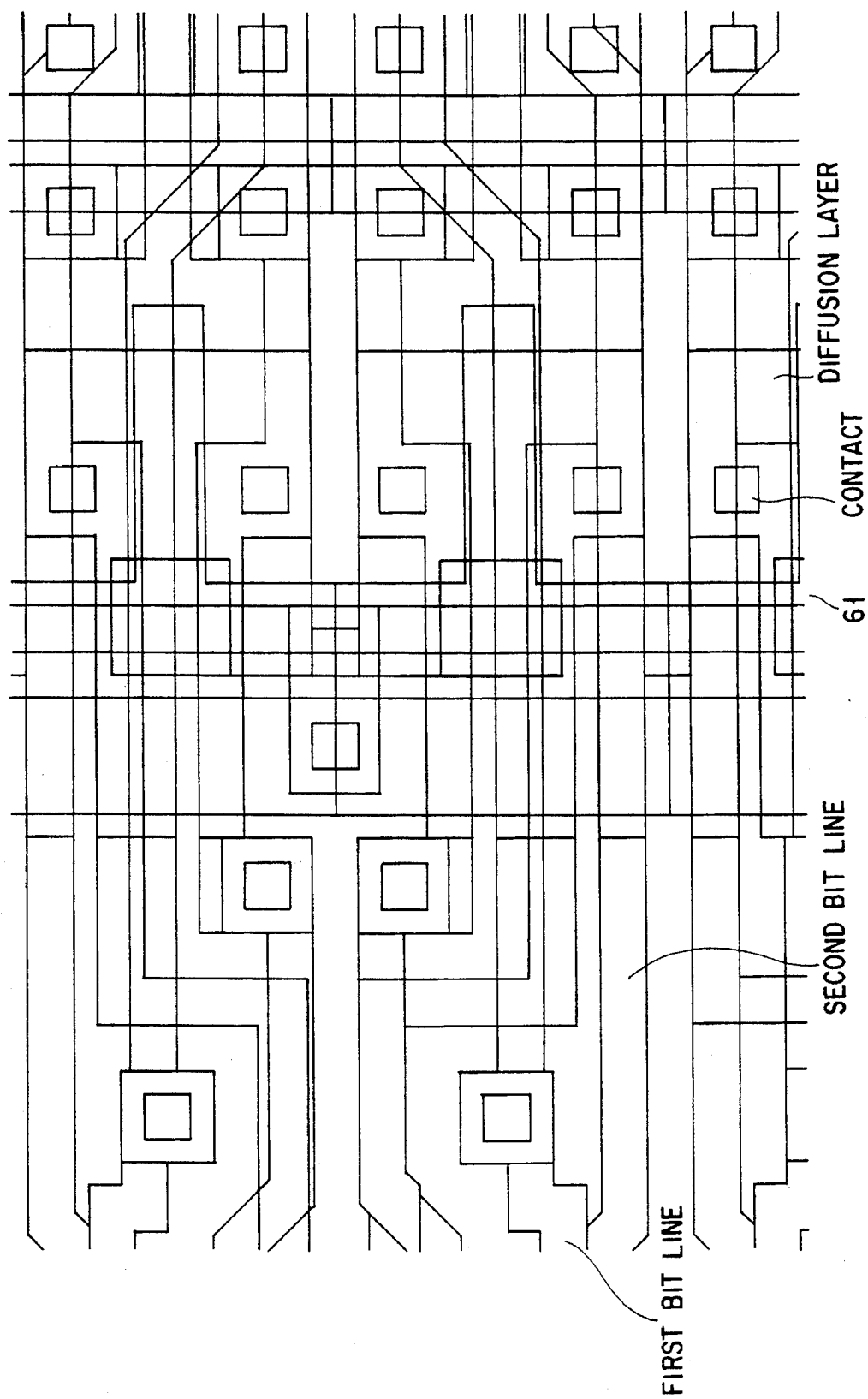
FIG. 22 shows a layout of an area where bit line connections are changed in the sense amplifier section of FIGS. 21A to 21D.
Figure 23:
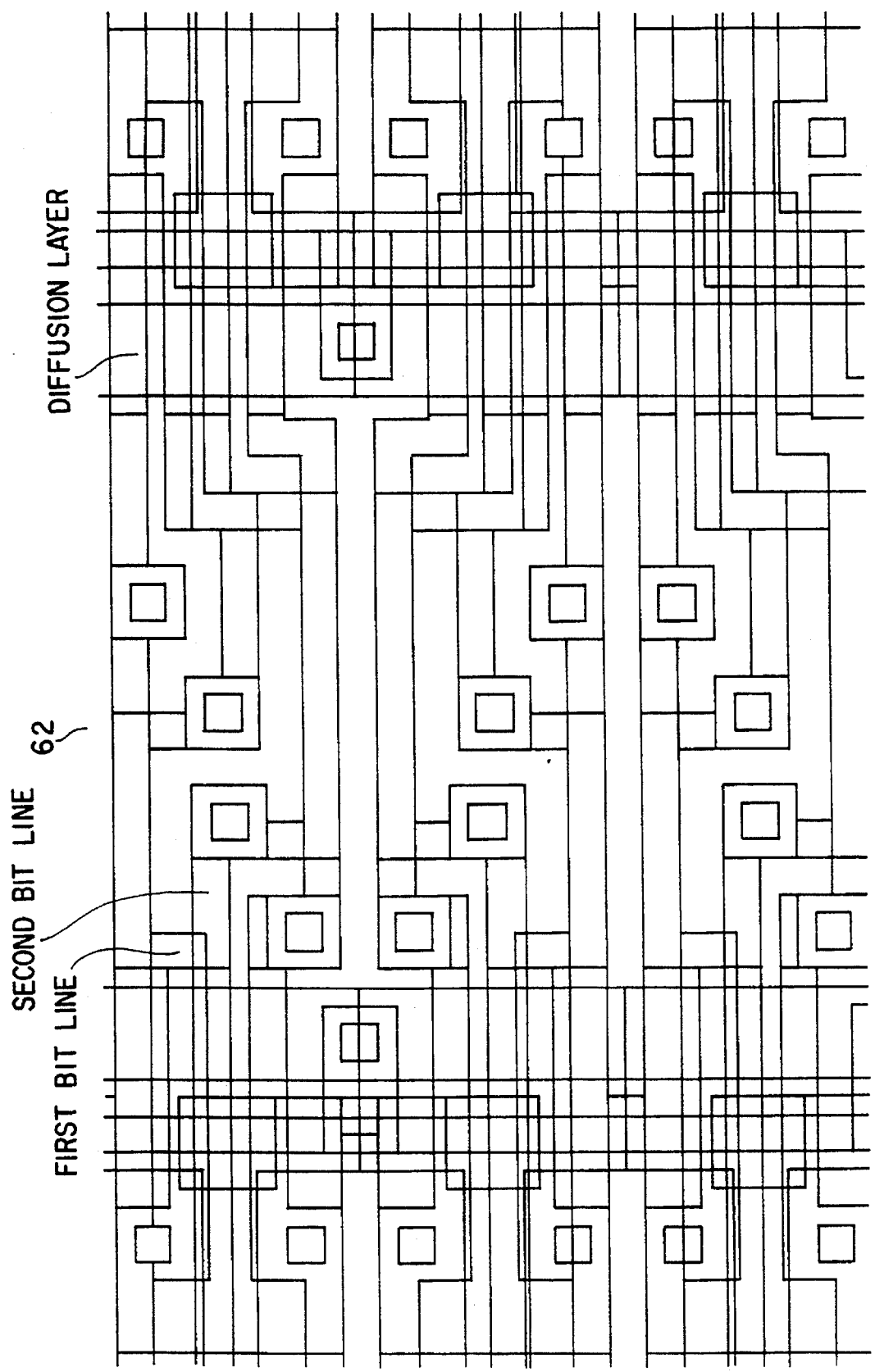
FIG. 23 shows a layout of an area where bit line connections are changed in the sense amplifier section of FIGS. 21A to 21D.

A single sense amplifier block SAG has a circuit configuration used in a DRAM using a general folded BL method. FIGS. 21A to 21D show examples of placing such sense amplifier blocks side by side and changing connections of the first bit line layer and the second bit line layer. FIGS. 22 and 23 show examples of pattern layouts of area 61 and area 62 where connections of bit lines are changed.

Figure 24:
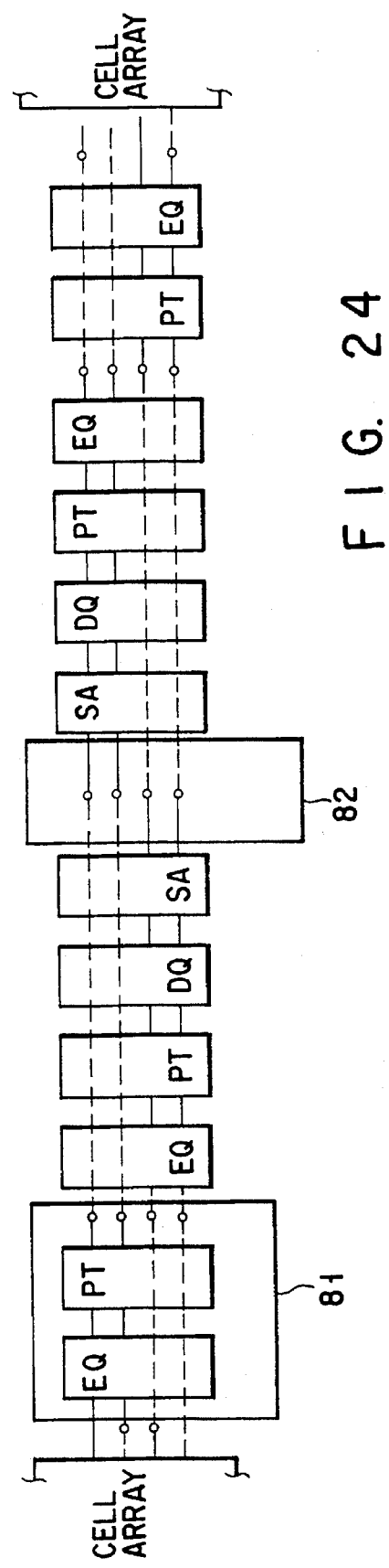
FIG. 24 shows another structure of the sense amplifier section used in the seventh embodiment.

FIG. 24 shows another structure of the sense amplifier section in the seventh embodiment. FIGS. 25A to 25D show layouts of bit-line layers etc. In comparison with FIGS. 20 to 21D, equalizer circuit EQ and transfer gate PT are placed on the cell array side, and the flip-flop circuits are placed side by side in the center of the sense amplifier circuit. Generally, in a circuit group constituting the sense amplifier block SAG, the sense amplifier circuit SA requires pMOS transistors. With the seventh embodiment, the sense amplifier circuits are placed side by side to group n-WELL areas into a single area in which pMOS transistors are to be formed, thereby reducing the WELL isolating areas which normally need a considerable area. As a result, the chip area can be reduced.

Figure 26:
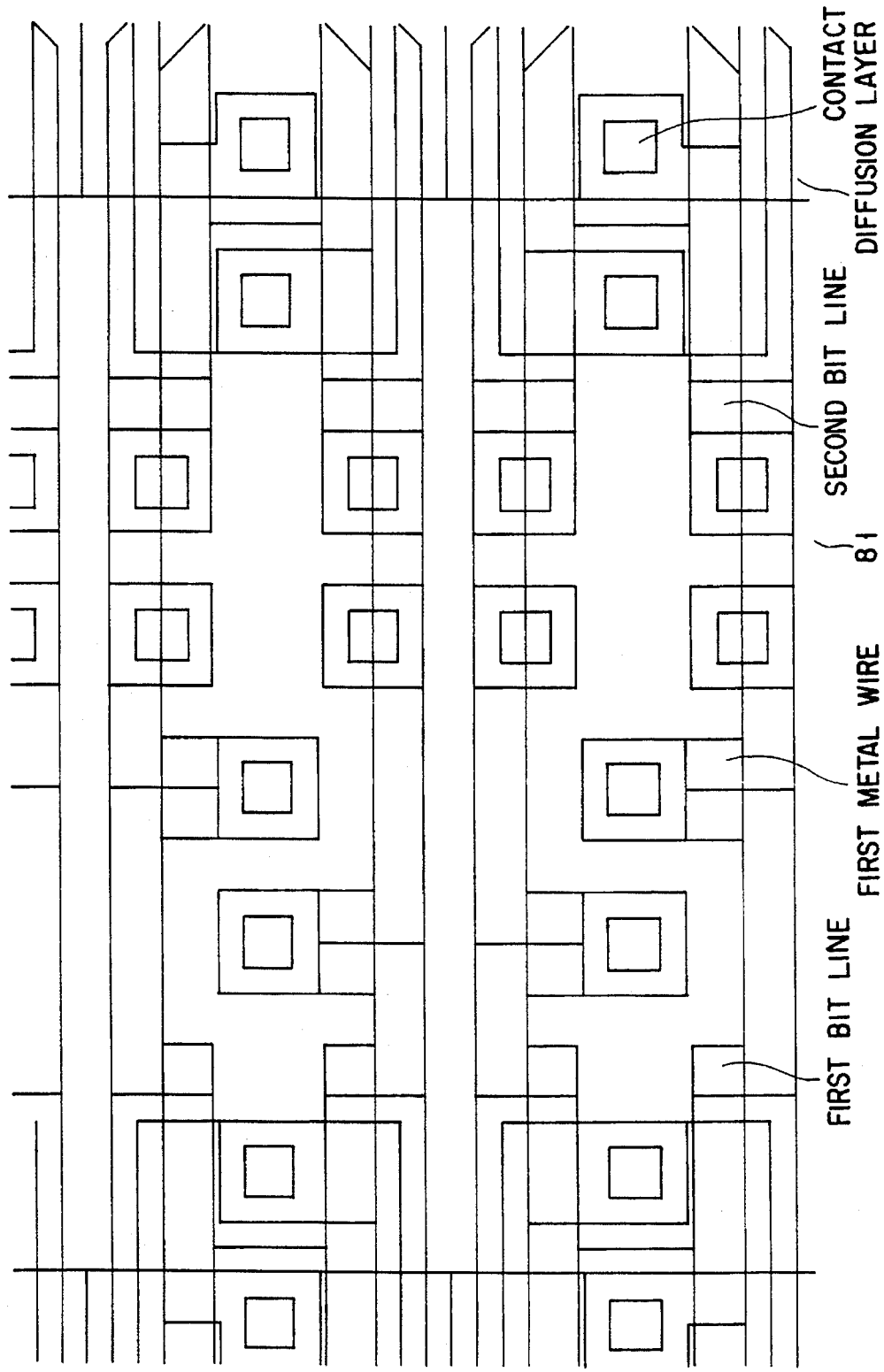
FIG. 26 shows a layout of an area where bit line connections are changed in the sense amplifier section of FIGS. 25A to 25D.
Figure 27:
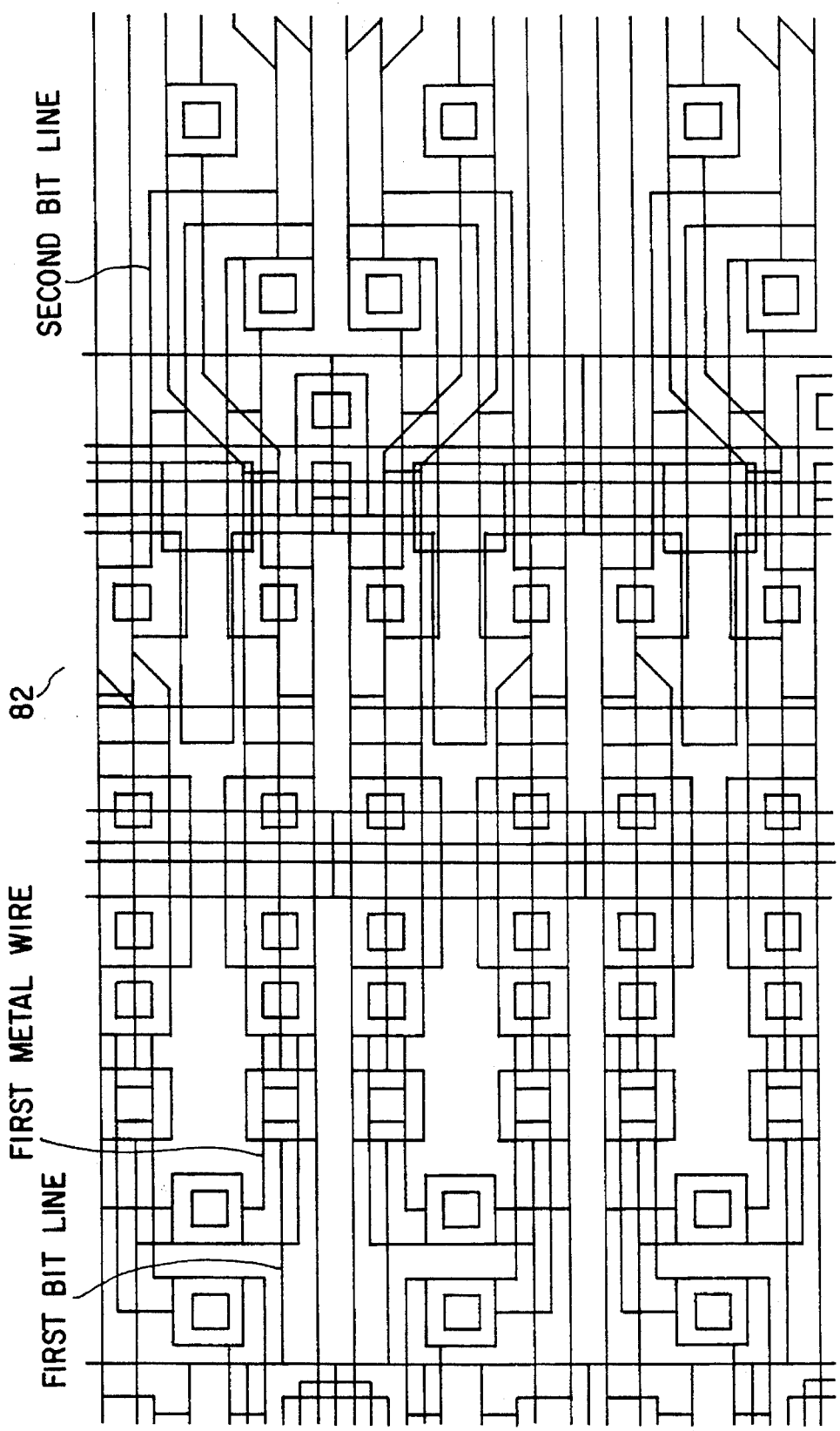
FIG. 27 shows a layout of an area where bit line connections are changed in the sense amplifier section of FIGS. 25A to 25D.

FIGS. 26 and 27 show pattern layouts of area 81 and area 82 where connections of bit lines are changed in the embodiment.

In the layouts shown in FIGS. 22, 23, 26, and 27, the first bit lines are directly connected to the second bit lines. The former are not necessarily directly connected to the latter. To simplify the manufacturing processes, the former may be connected to the latter via an overlying or underlying wiring layer, for example.

The present invention is not limited to the embodiments mentioned above.

While in the first to third embodiments, connections of the first bit lines and the second bit lines are changed and the first bit lines are allowed to cross the second bit lines in three dimensions, change of connections and multi-level crossing are not necessarily carried out at the same time. For instance, only either change of connections or multi-level crossing may be used.

For instance, while in the forth to seventh embodiments, two sense bit amplifier blocks are arranged side by side along the bit line, three or more sense amplifier blocks are arranged side by side. The memory cell structure is not necessarily a one-transistor/one-capacitor structure, but may be changeable according to the specification as desired.

The present invention may be practiced or embodied in still other ways without departing from the spirit or essential character thereof.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A dynamic semiconductor memory device comprising:

first bit line layer having a plurality of first bit lines;

a second bit line layer, which is laminated above said first bit line layer via an insulating layer, having a plurality of second bit lines to form bit-line pairs together with said first bit lines, to build a folded bit-line structure;

word lines arranged so as to cross said first bit lines and said second bit lines; and at least one memory cell array in which memory cells connected to said first bit lines and said second bit lines are arranged in a matrix, wherein said memory cell array includes first areas in which said memory cells are arranged, and second areas which are arranged so as to alternate with said first areas and contain no memory cell, and said second areas include areas where connection of said first and second bit lines of a specified number of said bit-line pairs are exchanged.

2. A dynamic semiconductor memory device according to claim 1, further comprising:

transfer gates placed between said memory cells and said first bit lines and connected to the respective first bit lines; and third bit lines connected to said memory cells and connected to said first bit lines via said transfer gates.

3. A dynamic semiconductor memory device according to claim 1, wherein said second areas include:

third areas where for half of said bit-line pairs, said first bit lines cross said second bit lines in three dimensions, and for the remaining half, said first bit lines are connected to said second bit lines, and said second bit lines are connected to said first bit lines; and fourth areas which are adjacent via said first areas to said third areas, where said first bit lines and said second bit lines of said bit-line pairs, for which said first bit lines are connected to said second bit lines and said second bit lines are connected to said first bit lines, cross each other in three dimensions, and for the remaining half of said bit-line pairs, said first bit lines are connected to said second bit lines and said second bit lines are connected to said first bit lines.

4. A dynamic semiconductor memory device according to claim 2, further comprising:

wires coupled to said first bit lines and said second bit lines, one end of each wire being connected via a first contact to said first bit line and the other end being connected via a second contact to said second bit line in said second area.

5. A dynamic semiconductor memory device according to claim 4, wherein the distance $P_1$ between one of said first and second contacts and said wire, if the width of and the spacing between said first bit lines and the width of and the spacing between said second bit lines are $L_1$, $S_1$, and $L_2$, $S_2$, respectively, fulfills $P_1$ being substantially equal to $S_1$ and $S_2$, and $S_1 \leq P_1 < 2S_1$ and $S_2 P_1 < 2S_2$.

6. A dynamic semiconductor memory device according to claim 3, further comprising:

wires coupled to said first bit lines and said second bit lines, one end of each wire being connected via a first contact to said first bit line and the other end being connected via a second contact to said second bit line in said third area and said fourth area.

7. A dynamic semiconductor memory device according to claim 6, wherein the distance $P_1$ between one of said first and second contacts and said wire, if the width of and the spacing between said first bit lines and the width of and the spacing between said second bit lines are $L_1$, $S_1$, and $L_2$, $S_2$, respectively, fulfills $P_1$ being substantially equal to $S_1$ and $S_2$ and $S_1 \leq P_1 < 2S_1$ and $S_2 \leq P_1 < 2S_2$.

8. A dynamic semiconductor memory device comprising:

first bit lines;

second bit lines which are partially laminated above said first bit lines and, together with said first bit lines, form bit-line pairs to build a folded bit-line structure;

word lines arranged so as to cross said first bit lines and said second bit lines; and at least one memory cell array in which memory cells connected to said first bit lines and said second bit lines are arranged in a matrix, wherein said memory cell array includes first areas which are provided with said memory cells, and a plurality of second memory areas which are arranged so as to alternate with said first areas and contain no memory cell, said first bit lines and said second bit lines construct first bit line pairs which are crossed each other in three dimensions in a second area and second bit line pairs which are connected therein, and said first bit line pairs are connected and said second bit line pairs are crossed each other in three dimensions in a third area adjacent via said first area to said second area.

9. A dynamic semiconductor memory device according to claim 8, further comprising:

wires coupled to said first bit lines and said second bit lines, one end of each wire being connected via a first contact to said first bit line and the other end being connected via a second contact to said second bit line in said third area and said fourth area.

10. A dynamic semiconductor memory device according to claim 9, wherein the distance $P_1$ between one of said first and second contacts and said wire, if the width of and the spacing between said first bit lines and the width of and the spacing between said second bit lines are $L_1$, $S_1$, and $L_2$, $S_2$, respectively, fulfills $P_1$ being substantially equal to $S_1$ and $S_2$, and $S_1 \leq P_1 < 2S_1$ and $S_2 \leq P_1 < 2S_2$.

11. A dynamic semiconductor memory device according to claim 8, further comprising:

transfer gates placed between said memory cells and said first bit lines and connected to the respective first bit lines; and third bit lines connected to said memory cells and also connected to said first bit lines via said transfer gates.

12. A dynamic semiconductor memory device according to claim 11, further comprising:

wires coupled to said first bit lines and said second bit lines, one end of each wire being connected via a first contact to said first bit line and the other end being connected via a second contact to said second bit line in said third area and said fourth area.

13. A dynamic semiconductor memory device according to claim 12, wherein the distance $P_1$ between one of the said first and second contacts and said wire, if the width of and the spacing between said first bit lines and the width of and the spacing between said second bit lines are $L_1$, $S_1$, and $L_2$, $S_3$, respectively, fulfills $P_1$ being substantially equal to $S_1$ and $S_2$, and $S_1 \leq P_1 < 2S_1$ and $S_2 \leq P_1 < 2S_2$.

* * * * *